US008642455B2

(12) United States Patent
Robinson et al.

(10) Patent No.: US 8,642,455 B2
(45) Date of Patent: *Feb. 4, 2014

(54) HIGH-THROUGHPUT PRINTING OF SEMICONDUCTOR PRECURSOR LAYER FROM NANOFLAKE PARTICLES

(76) Inventors: Matthew R. Robinson, San Jose, CA (US); Jeroen K. J. Van Duren, San Francisco, CA (US); Craig Leidholm, San Jose, CA (US); Brian M. Sager, Menlo Park, CA (US)

(*) Notice: Subject to any disclaimer, the term of this patent is extended or adjusted under 35 U.S.C. 154(b) by 663 days.

This patent is subject to a terminal disclaimer.

(21) Appl. No.: 12/763,146

(22) Filed: Apr. 19, 2010

(65) Prior Publication Data

US 2010/0267222 A1 Oct. 21, 2010

Related U.S. Application Data

(63) Continuation-in-part of application No. 11/361,433, filed on Feb. 23, 2006, now Pat. No. 7,700,464, which is a continuation-in-part of application No. 11/290,633, filed on Nov. 29, 2005, now Pat. No. 8,048,477, and a continuation-in-part of application No. 10/782,017, filed on Feb. 19, 2004, now Pat. No. 7,663,057, and a continuation-in-part of application No. 10/943,657, filed on Sep. 18, 2004, now Pat. No. 7,306,823, and a continuation-in-part of application No. 11/081,163, filed on Mar. 16, 2005, now Pat. No. 7,604,843, and a continuation-in-part of application No. 10/943,685, filed on Sep. 18, 2004.

(51) Int. Cl.
*H01L 21/20* (2006.01)
*B05D 5/12* (2006.01)

(52) U.S. Cl.
USPC ............. 438/502; 438/57; 438/63; 438/95; 427/74

(58) Field of Classification Search
USPC ........ 438/57, 63, 84, 85, 89, 95, 502; 427/64, 427/66, 67, 68, 74
See application file for complete search history.

(56) References Cited

U.S. PATENT DOCUMENTS 3,423,301 A 1/1969 Stearns
3,586,541 A 6/1971 Chamberlin
(Continued)

FOREIGN PATENT DOCUMENTS

DE 2741954 A 3/1979
EP 793277 A 9/1997
(Continued)

OTHER PUBLICATIONS

A. G. Munoz, S. B. Saidman, and J. B. Bessone, Electrodeposition of Indium onto Vitreous Carbon from Acid Chloride Solutions, Journal of The Electrochemical Society, 1999, 2123-2130, vol. 146, No. 6, Electrochemical Society Inc : USA.

(Continued)

*Primary Examiner* — Mary Wilczewski
(74) *Attorney, Agent, or Firm* — Joshua D. Isenberg; JDI Patent

(57) ABSTRACT

Methods and devices are provided for transforming non-planar or planar precursor materials in an appropriate vehicle under the appropriate conditions to create dispersions of planar particles with stoichiometric ratios of elements equal to that of the feedstock or precursor materials, even after selective forces settling. In particular, planar particles disperse more easily, form much denser coatings (or form coatings with more interparticle contact area), and anneal into fused, dense films at a lower temperature and/or time than their counterparts made from spherical nanoparticles. These planar particles may be nanoflakes that have a high aspect ratio. The resulting dense films formed from nanoflakes are particularly useful in forming photovoltaic devices.

20 Claims, 14 Drawing Sheets

(56) References Cited

U.S. PATENT DOCUMENTS

| | | | |
|---|---|---|---|
| 3,818,324 | A | 6/1974 | Espinasse |
| 3,891,519 | A | 6/1975 | Grellet |
| 3,903,427 | A | 9/1975 | Pack |
| 3,903,428 | A | 9/1975 | Dejong |
| 3,966,499 | A | 6/1976 | Yasui et al. |
| 3,966,568 | A | 6/1976 | Crossley et al. |
| 4,191,794 | A | 3/1980 | Biter et al. |
| 4,404,422 | A | 9/1983 | Green et al. |
| 4,410,758 | A | 10/1983 | Grolitzer |
| 4,522,663 | A | 6/1985 | Ovshinsky et al. |
| 4,615,741 | A | 10/1986 | Kobayashi et al. |
| 4,677,250 | A | 6/1987 | Barnett et al. |
| 4,806,436 | A | 2/1989 | Tada et al. |
| 4,869,755 | A | 9/1989 | Huschka et al. |
| 5,244,509 | A | 9/1993 | Arao et al. |
| 5,277,786 | A | 1/1994 | Kawakami |
| 5,372,888 | A | 12/1994 | Ogawa et al. |
| 5,401,573 | A | 3/1995 | Babel et al. |
| 5,554,670 | A | 9/1996 | Giannelis et al. |
| 5,558,723 | A | 9/1996 | Ufert |
| 5,578,503 | A | 11/1996 | Karg et al. |
| 5,677,250 | A | 10/1997 | Knapp |
| 5,728,231 | A | 3/1998 | Negami et al. |
| 5,925,228 | A | 7/1999 | Panitz et al. |
| 6,057,035 | A | 5/2000 | Singh et al. |
| 6,117,454 | A | 9/2000 | Kreuter et al. |
| 6,124,039 | A | 9/2000 | Goetz et al. |
| 6,127,202 | A * | 10/2000 | Kapur et al. ............ 438/47 |
| 6,130,465 | A | 10/2000 | Cole |
| 6,133,522 | A | 10/2000 | Kataoka et al. |
| 6,268,014 | B1 | 7/2001 | Eberspacher et al. |
| 6,413,645 | B1 | 7/2002 | Graff et al. |
| 6,472,467 | B1 | 10/2002 | Chiao |
| 6,573,652 | B1 | 6/2003 | Graff et al. |
| 6,623,861 | B2 | 9/2003 | Martin et al. |
| 6,727,513 | B2 | 4/2004 | Fujimori et al. |
| 6,818,163 | B1 | 11/2004 | Fibiger et al. |
| 6,821,559 | B2 | 11/2004 | Eberspacher et al. |
| 6,866,901 | B2 | 3/2005 | Burrows et al. |
| 6,897,603 | B2 | 5/2005 | Mao et al. |
| 6,908,496 | B2 | 6/2005 | Halas et al. |
| 6,951,398 | B2 | 10/2005 | Borra et al. |
| 6,974,976 | B2 | 12/2005 | Hollars |
| 7,144,627 | B2 | 12/2006 | Halas et al. |
| 7,306,823 | B2 | 12/2007 | Sager |
| 7,604,843 | B1 | 10/2009 | Robinson |
| 7,663,057 | B2 | 2/2010 | Yu |
| 7,700,464 | B2 * | 4/2010 | Robinson et al. .......... 438/502 |
| 7,898,054 | B2 | 3/2011 | Luch |
| 8,048,477 | B2 | 11/2011 | Van Duren |
| 2001/0054262 | A1 | 12/2001 | Nath et al. |
| 2002/0050287 | A1 | 5/2002 | Yamada et al. |
| 2002/0132045 | A1 | 9/2002 | Halas et al. |
| 2004/0033345 | A1 | 2/2004 | Dubertret et al. |
| 2004/0219730 | A1 * | 11/2004 | Basol ............................ 438/200 |
| 2005/0035983 | A1 | 2/2005 | Cruchon-Dupeyrat et al. |
| 2005/0072457 | A1 | 4/2005 | Glenn |
| 2005/0074551 | A1 | 4/2005 | Huang et al. |
| 2005/0150789 | A1 | 7/2005 | Crane |
| 2005/0175836 | A1 | 8/2005 | Kuehnle et al. |
| 2005/0183767 | A1 | 8/2005 | Yu |
| 2005/0235869 | A1 | 10/2005 | Cruchon-Dupeyrat et al. |
| 2006/0054506 | A1 | 3/2006 | Natan et al. |
| 2006/0060237 | A1 | 3/2006 | Leidholm |
| 2006/0062902 | A1 | 3/2006 | Sager |
| 2006/0134505 | A1 | 6/2006 | Wang et al. |
| 2006/0192955 | A1 | 8/2006 | Jorgenson et al. |
| 2006/0207644 | A1 | 9/2006 | Robinson et al. |
| 2006/0251874 | A1 | 11/2006 | Mcclure et al. |
| 2007/0092648 | A1 | 4/2007 | Van Duren |
| 2007/0163383 | A1 * | 7/2007 | Van Duren et al. ........... 75/255 |
| 2007/0163637 | A1 * | 7/2007 | Robinson et al. ............ 136/262 |
| 2007/0163638 | A1 * | 7/2007 | Van Duren et al. .......... 136/262 |
| 2007/0163639 | A1 * | 7/2007 | Robinson et al. ............ 136/262 |
| 2007/0163642 | A1 * | 7/2007 | Van Duren et al. .......... 136/262 |
| 2007/0166453 | A1 | 7/2007 | Van Duren et al. |
| 2008/0121277 | A1 * | 5/2008 | Robinson et al. ............ 136/256 |
| 2008/0124831 | A1 | 5/2008 | Robinson et al. |
| 2010/0267222 | A1 * | 10/2010 | Robinson et al. ............ 438/502 |

FOREIGN PATENT DOCUMENTS

| | | |
|---|---|---|
| JP | 63249379 A | 10/1988 |
| JP | 06196743 | 7/1994 |
| JP | 6289369 A | 10/1994 |
| KR | 2005119705 | 12/2005 |
| WO | 03043736 A | 5/2003 |

OTHER PUBLICATIONS

A. Kampmann, P. Cowache, D. Lincot, and J. Vedel, Junction Formation Studies of One-Step Electrodeposited CuInSe.sub.2 on CdS, Journal of The Electrochemical Society, 1999, 150-155, vol. 146, No. 1, Royal Society of Chemistry (Great Britain).

C. Eberspacher, K. L. Pauls, and C. V. Fredric, Improved processes for forming CuInSe.sub.2 films, UNISUN, 1-4, Newbury Park, CA.

C. Eberspacher, K. Pauls, and J. Serra, Non-vacuum processing of CIGS solar cells, UNISUN, 223-224, 2001, Newbury Park, CA.

C. Eberspacher, K. Pauls, and J. Serra, Non-vacuum processing of CIGS solar cells, UNISUN, pp. 1-5, 2003 Newbury Park, CA.

C. Guillen, and J. Herrero, Recrystallization and components redistribution processes in electrodeposited CuInSe.sub.2 thin films, Thin Solid Films, 2001, 57-59, vol. 387, Elsevier Science, Amsterdam : Netherlands.

Chinese Office Action from Chinese Application 20060034955.2 Aug. 12, 2010.

Chinese Office Action from Chinese Application 20060034955.2 Aug. 15, 2011.

Chinese Office Action from Chinese Application 200780016606.2 Nov. 21, 2011.

Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.

Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.

Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).

Contreras et al. "High Efficiency Cu (In, Ga)Se2-Based Solar Cells: Processing of Novel Absorber Structures" First WCPEC; Hawaii, Dec. 5-9, 1994, pp. 68-74.

D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu—In—Ga—Se Nanoparticle Colloids as Spray Deposition Precrusors for Cu(In, Ga)Se.sub.2 Solar Cell Materials, Journal of Electronic Materials, 1998, 433-437, vol. 27, No. 5, Minerals Metals & Materials Society : USA.

F. Tepper et al, "Nanosized Alumina Fibers", Advanced Materials, American Ceramic Society Bulletin, vol. 80, No. 6, Jun. 2001.

Freeman et al., Ag-Clad Au Nanoparticles: Novel Aggregation, Optical, and Surface-Enhanced Raman Scattering Properties, J. Phys. Chem., vol. 100, 1996, pp. 718-724.

G.. Norsworthy, C.R. Leidholm, A. Halani, V.K. Kapur. R. Roe, B.M. Basol, and R. Matson, CIS film growth by metallic ink coating and selenization, Solar Energy Materials & Solar Cells, 2000, 127-134, vol. 60, Elsevier Science, Amsterdam: Netherlands.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N.H.

(56) References Cited

OTHER PUBLICATIONS

George L. Schnable, Electrodeposition of Molten Metals and Alloys from Glycerine Solutions, Journal of the Electrochemical Society, Oct. 1961, 964-969, vol. 108, No. 10, Electrochemical Society Inc : USA.
Granqvist, C.G. and R.A. Buhrman. "Ultrafine metal particles". J. Applied Physics 47 (5): 220-2219 (1976).
Hambrock, J., Schroter, M.K., Birkner, A., Woll, C. and R.A. Fischer, "Nano-Brass: Bimetallic Copper / Zinc Colloids by a Nonacqueous Organometallic Route using [Cu(OCH(Me)CH2NMes)2] and Et2Zn as Precursors" Chem. Mater. 15: 4217-4222, (2003).
International Preliminary Report on Patentability for WO2006135377.
K.T. Ramakrishna Reddy, R.B.V. Chalapathy, M.A. Slifkin, A.W. Weiss, and R.W. Miles, Photoacousstic spectroscopy of sprayed $CuGa_xIn_{1-x}Se_2$ thin films, Thin Solid Films, 2001, 205-207, vol. 387, Elsevier Science, Amsterdam : Netherlands.
K.T.L. De Silva, W.A.A. Priyantha, J.K.D.S. Jayanetti, B.D. Chithrani, W. Siripala, K. Blake, and I.M. Dharmadasa, Electrodeposition and characterization of $CuInSe_2$ for applications in thin film solar cells, Thin Solid Films, 2001, 158-163, vol. 382, Elseiver Science, Amsterdam : Netherlands.
M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62. vol. 431-432, Elsevier Science, Amsterdam : Netherlands.
M. Kaelin, H. Zogg, A.N. Tiwari, O. Wilhelm, S.E. Pratsinis, T. Meyer, and A. Meyer, Electrosprayer and selenized Cu/In metal particle films, Thin Solid Films, 2004, 391-396, vol. 457, Elsevier Science, Amsterdam : Netherlands.
Marianna Kemell, Heini Saloniemi, Mikko Ritala, and Markku Leskela, Electrochemical Quartz Crystal Microbalance Study of the Electrodeposition Mechanisms of $CuInSe_2$ Thin Films, Journal of the Electrochemical Society, 2001, C110-C118, vol. 148, No. 2, Electrochemical Society: USA.
Markus E. Beck, and Michael Cocivera, Thin-film copper indium diselenide prepared by selenization of copper indium oxide formed by spray pyrolysis, Thin Solid Films, 1996, 71-82, vol. 272, Elseiver Publishing Company, Amsterdam.
Non-final Office Action dated Feb. 9, 2007 for U.S. Appl. No. 10/943,657.
Non-Final Office Action for U.S. Appl. No. 11/933,322 dated Mar. 31, 2011.
Notice of Allowance dated Jul. 25, 2007 for U.S. Appl. No. 10/943,657.
Supporting information for H. Yu, et al. "Heterogeneous Seed Growth: A Potentially General Synthesis of Monodisperse Metallic Nanoparticles".
T. Arita, N. Suyama, Y. Kita, S. Kitamura, T. Hibino, H. Takada, K. Omura, N. Ueno, and M. Murozono, $CuInSe_2$ films prepared by screen-printing and sintering method, 1988, IEEE.
Notice of Allowance in U.S. Appl. No. 11/933,322 dated Dec. 13, 2011.
Office Action dated Jul. 18, 2012 for U.S. Appl. No. 11/361,497.
Office Action from Chinese patent application Ser. No. 200680006141.8 Mar. 30, 2011.
Office Action in U.S. Appl. No. 11/933,322 dated Mar. 31, 2011.
PCT Written Opinion for WO2007106756 dated Sep. 29, 2008.
R.P. Raffaelle, J.G. Mantovani, S.G. Bailey, A.F. Hepp, E.M. Gordon and R. Haraway, Electrodeposited $CuInSe_2$ thin film junctions, Prepared for the 1997 Fall meeting sponsored by the Materials Research Society, Dec. 1-5, 1997, Boston, MA.
Rudmann et al."Efficiency Enhancement of Cu(In,Ga) Se2 Solar Cells Due to Post-deposition Na Incorporation" Applied Physics Letters vol. 84 No. 7, Feb. 16, 2004, p. 1129-1131.
S. Sun, C. B. Murray, D. Weller, L. Folks, A. Moser, "Monodisperse FePt Nanoparticles and Ferromagnetic FePt Nanocrystal Superlattices", Science, 287, pp. 1989-1992 (Mar. 17, 2000).
Sedoi V.S., Valevich V.V., Chemezova L.I. Production of submicron aerosols by the exploding wire method // Aerosols.—1998.—vol. 4e, No. 2.—pp. 41-47.
Sedoi V.S., Valevich V.V. "Direct production of nanosized powders by the exploding wire method" Physics, Chemistry & Applications of Nanostructures (Reviews).—In Russian.
Sedoi V.S., Valevich V.V. "Direct production of nanosized powders by the exploding wire method" Physics, Chemistry & Applications of Nanostructures (Reviews).—English Translation.
Sedoi V.S., Valevich V.V., Katz J.D. Generation of aerosols by the electrical explosiion of wires at reduced air pressure // Aerosols.—1998.—vol. 4e, No. 2.—p. 48-54.
Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.
Final Office Action mailed date Apr. 12, 2011 issed for U.S. Appl. No. 11/765,407.
Non-Final Office Action mailed date Aug. 4, 2010 issed for U.S. Appl. No. 11/765,407.
U.S. Appl. No. 10/943,685, filed Sep. 18, 2004, entitled "Formation of solar cells on foil substrates".
U.S. Appl. No. 10/782,017, to Dong Yu et al., filed Feb. 19, 2004, and entitled "Solution-Based Fabrication of Photovoltaic Cell".
U.S. Appl. No. 10/698,988, to Brian Sager and Martin Roscheisen, filed Oct. 31, 2003, and entitled "Inorganic/Organic Hybrid Nanolaminate Barrier Film".
Office Action dated Dec. 21, 2010 from U.S. Appl. No. 11/762,043.
Office Action dated Aug. 4, 2011 from U.S. Appl. No. 11/762,043.
Vijay K. Kapur, Ashish Bansal, Phucan Le, and Omar I. Asensio, Non-vacuum processing of $CuIn_{1-x}Ga_xSe_2$ solar cells on rigid and flexible substrates using nanoparticle precursor inks, Thin Solid Films, 2003, 53-57, vol. 431-432, Elsevier Publishing Company, Amsterdam.
Watanabe, JP 2001-044464, Machine Translation, Feb. 2001.
William M. Saltman and Norman H. Nachtrieb, The Electrochemistry of Gallium, Journal of the Electrochemical Society, Mar. 1953, 126-130, vol. 100, No. 3, Electrochemical Society Inc: USA.
Xue et al., "4.2% efficient organic photovoltaic cells with low series resistances", Appl. Phys. Lett. 84, 3013 (2004).
Office Action dated Aug. 19, 2011 from U.S. Appl. No. 11/278,648.
Non Final Office Action for U.S. Appl. No. 11/740,915, dated Jun. 20, 2013.
Non Final Office Action for U.S. Appl. No. 13/442,771, dated Aug. 7, 2013.
Non Final Office Action for U.S. Appl. No. 13/465,084, dated Jun. 17, 2013.
Notice of Allowance for U.S. Appl. No. 11/765,436, dated Jul. 3, 2013.

\* cited by examiner

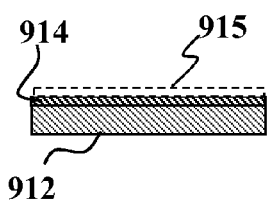 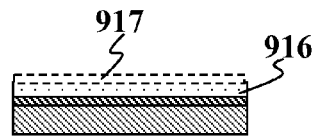 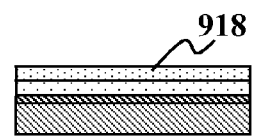
FIG. 13A　　　　FIG. 13B　　　　FIG. 13C
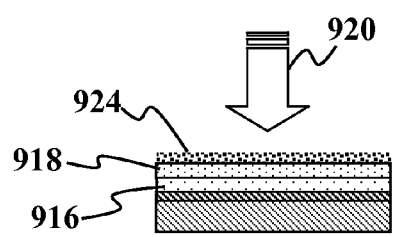 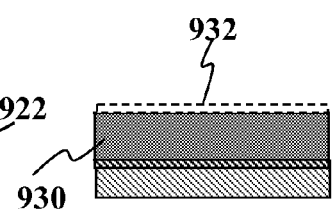
FIG. 13D　　　　FIG. 13E　　　　FIG. 13F
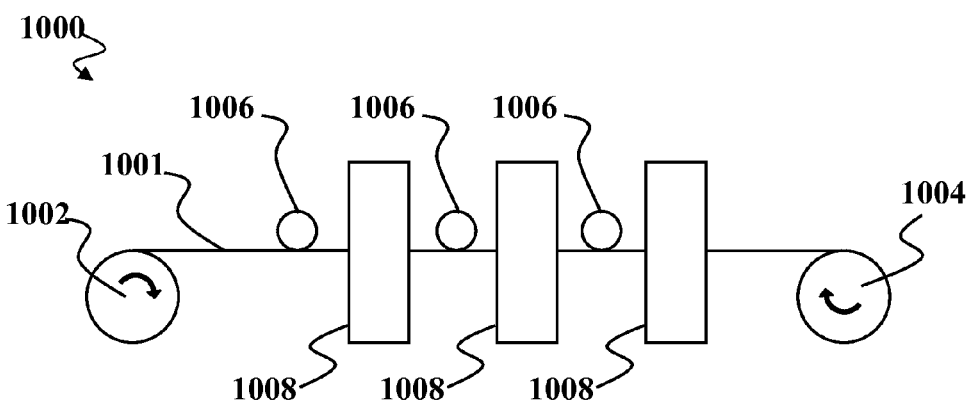
FIG. 14

HIGH-THROUGHPUT PRINTING OF SEMICONDUCTOR PRECURSOR LAYER FROM NANOFLAKE PARTICLES

CROSS-REFERENCE TO RELATED APPLICATION

This application is a continuation-in-part of commonly-assigned, co-pending U.S. patent application Ser. No. 11/361,433 filed on Feb. 23, 2006, which is a continuation-in-part of commonly-assigned, co-pending application Ser. No. 11/290,633 entitled "CHALCOGENIDE SOLAR CELLS" filed Nov. 29, 2005 and Ser. No. 10/782,017, entitled "SOLUTION-BASED FABRICATION OF PHOTOVOLTAIC CELL" filed Feb. 19, 2004 and published as U.S. patent application publication 20050183767, the entire disclosures of which are incorporated herein by reference. U.S. patent application Ser. No. 11/361,433 is also a continuation-in-part of commonly-assigned, co-pending U.S. patent application Ser. No. 10/943,657, entitled "COATED NANOPARTICLES AND QUANTUM DOTS FOR SOLUTION-BASED FABRICATION OF PHOTOVOLTAIC CELLS" filed Sep. 18, 2004, the entire disclosures of which are incorporated herein by reference. This application is a also continuation-in-part of commonly-assigned, co-pending U.S. patent application Ser. No. 11/081,163, entitled "METALLIC DISPERSION", filed Mar. 16, 2005, the entire disclosures of which are incorporated herein by reference. U.S. patent application Ser. No. 11/361,433 is a also continuation-in-part of commonly-assigned, co-pending U.S. patent application Ser. No. 10/943,685, entitled "FORMATION OF CIGS ABSORBER LAYERS ON FOIL SUBSTRATES", filed Sep. 18, 2004, the entire disclosures of which are incorporated herein by reference. All applications listed above are fully incorporated herein by reference for all purposes.

FIELD OF THE INVENTION

This invention relates generally to semiconductor films, and more specifically, to the fabrication of solar cells that use semiconductor films based on IB-IIIA-VIA compounds.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, Cu(In, Ga)(S, Se)$_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide (ZnO$_x$) is formed on the junction partner layer and is typically used as a transparent electrode. CIS-based solar cells have been demonstrated to have power conversion efficiencies exceeding 19%.

A central challenge in cost-effectively constructing a large-area CIGS-based solar cell or module is that the elements of the CIGS layer must be within a narrow stoichiometric ratio on nano-, meso-, and macroscopic length scale in all three dimensions in order for the resulting cell or module to be highly efficient. Achieving precise stoichiometric composition over relatively large substrate areas is, however, difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform three-dimensional distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternatives to traditional vacuum-based deposition techniques have been developed. In particular, production of solar cells on flexible substrates using non-vacuum, semiconductor printing technologies provides a highly cost-efficient alternative to conventional vacuum-deposited solar cells. For example, T. Arita and coworkers [20th IEEE PV Specialists Conference, 1988, page 1650] described a non-vacuum, screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the Cu—In—Se$_2$ phase. However, solar cells fabricated from the sintered layers had very low efficiencies because the structural and electronic quality of these absorbers was poor.

Screen-printed Cu—In—Se$_2$ deposited in a thin-film was also reported by A. Vervaet et al. [9th European Communities PV Solar Energy Conference, 1989, page 480], where a micron-sized Cu—In—Se$_2$ powder was used along with micron-sized Se powder to prepare a screen printable paste. Layers formed by non-vacuum, screen printing were sintered at high temperature. A difficulty in this approach was finding an appropriate fluxing agent for dense Cu—In—Se$_2$ film formation. Even though solar cells made in this manner had poor conversion efficiencies, the use of printing and other non-vacuum techniques to create solar cells remains promising.

There is a widespread notion in the field, and certainly in the CIGS non-vacuum precursor field, that the most optimized dispersions and coating contain spherical particles and that any other shape is less desirable in terms of dispersion stability and film packing, particularly when dealing with nanoparticles. Accordingly, the processes and theories that dispersion chemists and coating engineers are geared toward involve spherical particles. Because of the high density of metals used in CIGS non-vacuum precursors, especially those incorporating pure metals, the use of spherical particles requires a very small size in order to achieve a well dispersed media. This then requires that each component be of similar size in order to maintain desired stoichiometric ratios, since otherwise, large particles will settle first. Additionally, spheroids are thought to be useful to achieve high packing density on a packing unit/volume basis, but even at high density, spheres only contact at tangential points which represent a very small fraction of interparticle surface area. Furthermore, minimal flocculation is desired to reduce clumping if good atomic mixing is desired in the resulting film.

Due to the aforementioned issues, many experts in the non-vacuum precursor CIGS community desire spherical nanoparticles in sizes that are as small as they can achieve. Although the use of traditional spherical nanoparticles is still promising, many fundamental challenges remain, such as the difficulty in obtaining small enough spherical nanoparticles in high yield and low cost (especially from CIGS precursor materials) or the difficulty in reproducibly obtaining high quality films. Furthermore, the lower interparticle surface area at contact points between spheroidal particles may serve to impede rapid processing of these particles since the reaction dynamics depend in many ways on the amount of surface area contact between particles.

SUMMARY OF THE INVENTION

Embodiments of the present invention address at least some of the drawbacks set forth above. The present invention provides for the use of non-spherical particles in the formation of high quality precursor layers which are processed into dense films. The resulting dense films may be useful in a variety of industries and applications, including but not limited to, the manufacture of photovoltaic devices and solar cells. More specifically, the present invention has particular application in the formation of precursor layers for thin film solar cells. The present invention provides for more efficient and simplified creation of a dispersion, and the resulting coating thereof. It should be understood that this invention is generally applicable to any processes involving the deposition of a material from dispersion. At least some of these and other objectives described herein will be met by various embodiments of the present invention.

In one embodiment of the present invention, a method is provided for transforming non-planar and/or planar precursor metals in an appropriate vehicle under the appropriate conditions to create dispersions of planar particles with stoichiometric ratios of elements equal to that of the feedstock or precursor metals, even after selective settling. In particular, planar particles described herein have been found to be easier to disperse, form much denser coatings, and anneal into films at a lower temperature and/or time than their counterparts made from spherical nanoparticles that have substantially similar composition but different morphology. Additionally, even unstable dispersions using large microflake particles that may require continuous agitation to stay suspended still create good coatings. In one embodiment of the present invention, a stable dispersion is one that remains dispersed for a period of time sufficient to allow a substrate to be coated. In one embodiment, this may involve using agitation to keep particles dispersed in the dispersion. In other embodiments, this may include dispersions that settle but can be re-dispersed by agitation and/or other methods when the time for use arrives.

In another embodiment of the present invention, a method is provided that comprises of formulating an ink of particles wherein substantially all of the particles are nanoflakes. In one embodiment, at least about 95% of all particles (based on total weight of all particles) are nanoflakes. In one embodiment, at least about 99% of all particles (based on total weight of all particles) are nanoflakes. In one embodiment, all particles are nanoflakes. In yet another embodiment, all particles are microflakes and/or nanoflakes. Substantially each of the nanoflakes contains at least one element from group IB, IIIA and/or VIA, wherein overall amounts of elements from group IB, IIIA and/or VIA contained in the ink are such that the ink has a desired or close to a desired stoichiometric ratio of the elements for at least the elements of group IB and IIIA. The method includes coating a substrate with the ink to form a precursor layer and processing the precursor layer in a suitable atmosphere to form a dense film. The dense film may be used in the formation of a semiconductor absorber for a photovoltaic device. The film may comprise of a fused version of the precursor layer which comprises of a plurality of individual particles which are unfused.

In yet another embodiment of the present invention, a material is provided that comprises of a plurality of nanoflakes having a material composition containing at least one element from Groups IB, IIIA, and/or VIA. The nanoflakes are created by milling or size reducing precursor particles characterized by a precursor composition that provides sufficient ductility (better: malleability, see later in patent) to form a planar shape from a non-planar and/or planar starting shape when milled or size reduced, and wherein overall amounts of elements from Groups IB, IIIA and/or VIA contained in the precursor particles combined are at a desired or close to a desired stoichiometric ratio of the elements for at least the elements of groups IB and IIIA. In one embodiment, planar includes those that particles that are wide in two dimensions, thin in every other dimension. The milling may transform substantially all of the precursor particles into nanoflakes. Alternatively, the milling transforms at least 50% of the precursor particles into nanoflakes. The milling may occur in an oxygen-free atmosphere to create oxygen-free nanoflakes. The milling may occur in an inert gas environment to create oxygen-free nanoflakes. These non-spherical particles may be nanoflakes that have its largest dimension (thickness and/or length and/or width) greater than about 20 nm, since sizes smaller than that tend to create less efficient solar cells. Milling can also be chilled and occur at a temperature lower than room temperature to allow milling of particles composed of low melting point material. In other embodiments, milling may occur at room temperature. Alternatively, milling may occur at temperatures greater than room temperature to obtain the desired malleability of the material. In one embodiment of the present invention, the material composition of the feedstock particles preferably exhibits a malleability that allows non-planar feedstock particles to be formed into substantially planar nanoflakes at the appropriate temperature. In one embodiment, the nanoflakes have at least one surface that is substantially flat.

In a still further embodiment according to the present invention, a solar cell is provided that comprises of a substrate, a back electrode formed over the substrate, a p-type semiconductor thin film formed over the back electrode, an n-type semiconductor thin film formed so as to constitute a pn junction with the p-type semiconductor thin film, and a transparent electrode formed over the n-type semiconductor thin film. The p-type semiconductor thin film results by processing a dense film formed from a plurality of nanoflakes having a material composition containing at least one element from Groups IB, IIIA, and/or VIA, wherein the resulting film has a void volume of 26% or less. In one embodiment, this number may be based on free volume of packed spheres of different diameter to minimize void volume. In another embodiment of the invention, the dense film has a void volume of about 30% or less. In other embodiments, the void volume is about 20% or less. In still other embodiments, the void volume is about 10% or less.

In another embodiment of the present invention, a method is provided for forming a film by using particles with particular properties. The properties may be based on interparticle size, shape, composition, and morphology distribution. As a nonlimiting example, the particles may be nanoflakes within a desired size range. Within the nanoflakes, the morphology may include particles that are amorphous, those that are crystalline, those that are more crystalline than amorphous, and those that are more amorphous than crystalline. The properties may also be based on interparticle composition and morphology distribution. In one embodiment of the present invention, it should be understood that the resulting flakes have a morphology where the flakes are less crystalline than the feedstock material from which the flakes are formed. Flakes are particles with at least one substantially planar surface and may include both nanoflakes and/or microflakes.

In yet another embodiment of the present invention, the method comprises formulating an ink of particles wherein about 50% or more of the particles (based on the total weight of all particles) are flakes each containing at least one element from group IB, IIIA and/or VIA and having a non-spherical, planar shape, wherein overall amounts of elements from group IB, IIIA and/or VIA contained in the ink are such that the ink has a desired stoichiometric ratio of the elements. In another embodiment, the term "50% or more" may be based on the number of particles versus the total number of particles in the ink. In yet another embodiment, at least about 75% or more of the particles (by weight or by number) are nanoflakes. The method includes coating a substrate with the ink to form a precursor layer and processing the precursor layer in a suitable processing condition to form a film. The film may be used in the formation of a semiconductor absorber for a photovoltaic device. It should be understood that suitable processing conditions may include, but are not limited to, atmosphere composition, pressure, and/or temperature. In one embodiment, substantially all of the particles are flakes with a non-spherical, planar shape. In one embodiment, at least 95% of all particles (based on weight of all particles combined) are flakes. In another embodiment, at least 99% of all particles (based on weight of all particles combined) are flakes. The flakes may be comprised of nanoflakes. In other embodiments, the flakes may be comprised of both microflakes and nanoflakes.

It should be understood that the planar shape of the nanoflakes may provide a number of advantages. As a non-limiting example, the planar shape may create greater surface area contact between adjacent nanoflakes that allows the dense film to form at a lower temperature and/or shorter time as compared to a film made from a precursor layer using an ink of spherical nanoparticles wherein the nanoparticles have a substantially similar material composition and the ink is otherwise substantially identical to the ink of the present invention. The planar shape of the nanoflakes may also create greater surface area contact between adjacent nanoflakes that allows the dense film to form at an annealing temperature at least 50 degrees C. less as compared to a film made from a precursor layer using an ink of spherical nanoparticles that is otherwise substantially identical to the ink of the present invention.

The planar shape of the nanoflakes may create greater surface area contact between adjacent nanoflakes relative to adjacent spherical nanoparticles and thus promotes increased atomic intermixing as compared to a film made from a precursor layer made from an ink of the present invention. The planar shape of the nanoflakes creates a higher packing density in the dense film as compared to a film made from a precursor layer made from an ink of spherical nanoparticles of the same composition that is otherwise substantially identical to the ink of the present invention.

The planar shape of the nanoflakes may also create a packing density of at least about 76% in the precursor layer. The planar shape of the nanoflakes may create a packing density of at least 80% in the precursor layer. The planar shape of the nanoflakes may create a packing density of at least 90% in the precursor layer. The planar shape of the nanoflakes may create a packing density of at least 95% in the precursor layer. Packing density may be mass/volume, solids/volume, or non-voids/volume.

The planar shape of the nanoflakes results in grain sizes of at least about 1 micron in the semiconductor absorber of a photovoltaic device. The planar shape of the nanoflakes may results in grain sizes of at least about 2.0 µm in at least one dimension in the semiconductor absorber of a photovoltaic device. In other embodiments, the nanoflakes results in grain sizes of at least about 1.0 µm in at least one dimension in the semiconductor absorber of a photovoltaic device. In still further embodiments, the nanoflakes results in grain sizes of at least about 0.5 µm in at least one dimension in the semiconductor absorber of a photovoltaic device. The planar shape of the nanoflakes may result in grain sizes of at least about 0.3 µm wide in the semiconductor absorber of a photovoltaic device. In other embodiments, the planar shape of the nanoflakes results in grain sizes of at least about 0.3 µm wide in the semiconductor absorber of a photovoltaic device when the nanoflakes are formed from one or more of the following: copper selenide, indium selenide, or gallium selenide.

The planar shape of the nanoflakes provides a material property to avoid rapid and/or preferential settling of the particles when forming the precursor layer. The planar shape of the nanoflakes provides a material property to avoid rapid and/or preferential settling of nanoflakes having different material compositions, when forming the precursor layer. The planar shape of the nanoflakes provides a material property to avoid rapid and/or preferential settling of nanoflakes having different particle sizes, when forming the precursor layer. The planar shape of the nanoflakes provides a material property to avoid grouping of nanoflakes in the ink and thus enables a finely dispersed solution of nanoflakes.

The planar shape of the nanoflakes provides a material property to avoid undesired grouping of nanoflakes of a particular class in the ink and thus enables an evenly dispersed solution of nanoflakes. The planar shape of the nanoflakes provides a material property to avoid undesired grouping of nanoflakes of a specific material composition in the ink and thus enables an evenly dispersed solution of nanoflakes. The planar shape of the nanoflakes provides a material property to avoid grouping of nanoflakes of a specific phase separation in the precursor layer resulting from the ink. The nanoflakes have a material property that reduces surface tension at interface between nanoflakes in the ink and a carrier fluid to improve dispersion quality.

In one embodiment of the present invention, the ink may be formulated by use of a low molecular weight dispersing agent whose inclusion is effective due to favorable interaction of the dispersing agent with the planar shape of the nanoflakes. The ink may be formulated by use of a carrier liquid and without a dispersing agent. The planar shape of the nanoflakes provides a material property to allow for a more even distribution of group IIIA material throughout in the dense film as compared to a film made from a precursor layer made from an ink of spherical nanoparticles that is otherwise substantially identical to the ink of the present invention. In another embodiment, the nanoflakes may be of random planar shape and/or a random size distribution.

The nanoflakes may be of non-random planar shape and/or a non-random size distribution. The nanoflakes may each have a length and/or largest lateral dimension less than about 500 nanometers and greater than about 20 nanometers. The nanoflakes may each have a length and/or largest lateral dimension between about 300 nanometers and 50 nanometers. The nanoflakes may each have a thickness of about 100 nm or less. In other embodiments, the lengths of the planar nanoflakes are about 500 nm to about 1 nm. As a nonlimiting example, the nanoflakes may have lengths and/or largest lateral dimension of about 300 nm to about 10 nm. In other embodiments, the nanoflakes may be of thickness in the range of about 200 nm to about 20 nm. In another embodiment, these nanoflakes may be of thickness in the range of about 100 nm to about 10 nm. In one embodiment, these nanoflakes may be of thickness in the range of about 200 nm to about 20 nm. The nanoflakes may each have a thickness less than about 50 nm. The nanoflakes thicknesses of less than about 20 nm. The nanoflakes may have an aspect ratio of at least about 5 or more. The nanoflakes may have an aspect ratio of at least about 10 or more. The nanoflakes have an aspect ratio of at least about 15 or more.

The nanoflakes may be oxygen free. The nanoflakes may be a single metal. The nanoflakes may be an alloy of group IB, IIIA elements. The nanoflakes may be a binary alloy of group IB, IIIA elements. The nanoflakes may be a ternary alloy of group IB, IIIA elements. The nanoflakes may be a quaternary alloy of group IB, IIIA, and/or VIA elements. The nanoflakes may be group IB-chalcogenide particles and/or group IIIA-chalcogenide particles. Again, the particles may be particles that are substantially oxygen-free, which may include those that include less than about 1 wt % of oxygen. Other embodiments may use materials with less than about 5 wt % of oxygen. Still other embodiments may use materials with less than about 3 wt % oxygen. Still other embodiments may use materials with less than about 2 wt % oxygen. Still other embodiments may use materials with less than about 0.5 wt % oxygen. Still other embodiments may use materials with less than about 0.1 wt % oxygen.

In one embodiment of the present invention, the coating step occurs at room temperature. The coating step may occur at atmospheric pressure. The method may further comprise depositing a film of selenium onto the dense film. The processing step may be accelerated via thermal processing techniques using at least one of the following: pulsed thermal processing, exposure to a laser beam, or heating via IR lamps, and/or similar or related methods. The processing may comprise of heating the precursor layer to a temperature greater than about 375° C. but less than a melting temperature of the substrate for a period of less than 15 minutes. The processing may comprise of heating the precursor layer to a temperature greater than about 375° C. but less than a melting temperature of the substrate for a period of 1 minute or less. In another embodiment of the present invention, processing may comprise of heating the precursor layer to an annealing temperature but less than a melting temperature of the substrate for a period of 1 minute or less. The suitable atmosphere may comprise of a hydrogen atmosphere. In another embodiment of the present invention, the suitable atmosphere comprises a nitrogen atmosphere. In yet another embodiment, the suitable atmosphere comprises a carbon monoxide atmosphere. The suitable atmosphere may be comprised of an atmosphere having less than about 10% hydrogen. The suitable atmosphere may be comprised of an atmosphere containing selenium. The suitable atmosphere may be comprised of an atmosphere of a non-oxygen chalcogen. In one embodiment of the present invention, the suitable atmosphere may comprise of a selenium atmosphere providing a partial pressure greater than or equal to vapor pressure of selenium in the precursor layer. In another embodiment, the suitable atmosphere may comprise of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure. In yet another embodiment, the chalcogen atmosphere may be used with one or more binary chalcogenides (in any shape or form) at a partial pressure of the chalcogen greater than or equal to a vapor pressure of the chalcogen at the processing temperature and processing pressure to minimize loss of chalcogen from the precursor layer, wherein optionally, the processing pressure is a non-vacuum pressure.

In yet another embodiment of the present invention, prior to the step of formulating the ink, there is included a step of creating nanoflakes. The creating step comprises of providing feedstock particles containing at least one element of groups IB, IIIA, and/or VIA, wherein substantially each of the feedstock particles have a composition of sufficient malleability to form a planar shape from a non-planar starting shape and milling the feedstock particles to reduce at least the thickness of each particle to less than 100 nm. The milling step may occur in an oxygen free atmosphere to create substantially oxygen-free nanoflakes. The substrate may be a rigid substrate. The substrate may be a flexible substrate. The substrate may be an aluminum foil substrate or a polymer substrate, which is a flexible substrate in a roll-to-roll manner (either continuous or segmented) using a commercially available web coating system. The rigid substrate may be comprised of at least one material selected from the group: glass, soda-lime glass, steel, stainless steel, aluminum, polymer, ceramic, metal plates, metallized ceramic plates, metallized polymer plates, metallized glass plates, and/or any single or multiple combination of the aforementioned. The substrate may be at different temperatures than the precursor layer during processing. This may enable the substrate to use materials that would melt or become unstable at the processing temperature of the precursor layer. Optionally, this may involve actively cooling the substrate during processing.

In yet another embodiment of the present invention, a method is provided for formulating an ink of particles wherein a majority of the particles are nanoflakes each containing at least one element from group IB, IIIA and/or VIA and having a non-spherical, planar shape, wherein the overall amounts of the elements from group IB, IIIA and/or VIA contained in the ink are such that the ink has a desired stoichiometric ratio of the elements. The method may include coating a substrate with the ink to form a precursor layer, and processing the precursor layer to form a dense film for growth of a semiconductor absorber of a photovoltaic device. In one embodiment, at least 60% of the particles (by weight or by number) are microflakes. In yet another embodiment, at least 70% of the particles (by weight or by number) are microflakes. In another embodiment, at least 80% of the particles (by weight or by number) are microflakes. In another embodiment, at least 90% of the particles (by weight or by number) are microflakes. In another embodiment, at least 95% of the particles (by weight or by number) are microflakes.

A further understanding of the nature and advantages of the invention will become apparent by reference to the remaining portions of the specification and drawings.

BRIEF DESCRIPTION OF THE DRAWINGS

FIGS. 13A-13F show the use of a chemical gradient according to one embodiment of the present invention.

FIG. 14 shows a roll-to-roll system according to the present invention.

DESCRIPTION OF THE SPECIFIC EMBODIMENTS

Figure 1A:
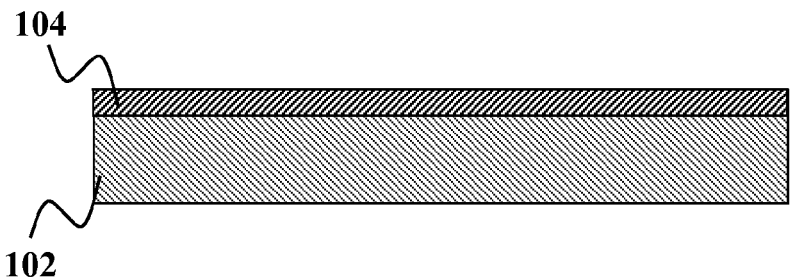
FIGS. 1A-1D are schematic cross-sectional diagrams illustrating fabrication of a film according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

According to embodiments of the present invention, an active layer for a photovoltaic device may be fabricated by first formulating an ink of non-spherical particles each containing at least one element from groups IB, IIIA and/or VIA, coating a substrate with the ink to form a precursor layer, and heating the precursor layer to form a dense film. Optionally, it should be understood that in some embodiments, densification of the precursor layer may not be needed, particularly if the precursor materials are oxygen-free and/or substantially oxygen-free. Thus, the heating step may optionally be skipped if the particles are processed air-free and are oxygen-free. In a preferred embodiment, the non-spherical particles are nanoflakes that are substantially planar in shape. The dense film may be processed in a suitable atmosphere to form a group IB-IIIA-VIA compound. The resulting group IB-IIIA-VIA compound is preferably a compound of Cu, In, Ga and selenium (Se) or sulfur S of the form $CuIn_{(1-x)}Ga_xS_{2(1-y)}Se_{2y}$, where $0 \leq x \leq 1$ and $0 \leq y \leq 1$. It should also be understood that the resulting group IB-IIIA-VIA compound may be a compound of Cu, In, Ga and selenium (Se) or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$.

It should be understood that group IB, IIIA, and VIA elements other than Cu, In, Ga, Se, and S may be included in the description of the IB-IIIA-VIA materials described herein, and that the use of a hyphen ("-" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used.

Method of Forming a Film

Referring now to FIG. 1, one method of forming a semiconductor film according to the present invention will now be described. It should be understood that the present embodiment of the invention uses non-vacuum techniques to form the semiconductor film. Other embodiments, however, may form the film under a vacuum environment, and the present invention using non-spherical particles is not limited to only non-vacuum coating techniques.

As seen in FIG. 1, a substrate 102 is provided. By way of non-limiting example, the substrate 102 may be made of a metal such as aluminum. In other embodiments, metals such as stainless steel, molybdenum, or combinations of the foregoing may be used as the substrate 102. These substrates may be in the form of foils, sheets, rolls, or the like. Depending on the material of the substrate 102, it may be useful to coat a surface of the substrate 102 with a contact layer 104 to promote electrical contact between the substrate 102 and the absorber layer that is to be formed on it. As a nonlimiting example, when the substrate 102 is made of aluminum, the contact layer 104 may be a layer of molybdenum. For the purposes of the present discussion, the contact layer 104 may be regarded as being part of the substrate. As such, any discussion of forming or disposing a material or layer of material on the substrate 102 includes disposing or forming such material or layer on the contact layer 104, if one is used. Optionally, other layers of materials may also be used with the contact layer 104 for insulation or other purposes and still considered part of the substrate 102. It should be understood that the contact layer 104 may comprise of more than one type or more than one discrete layer of material.

Figure 1B:
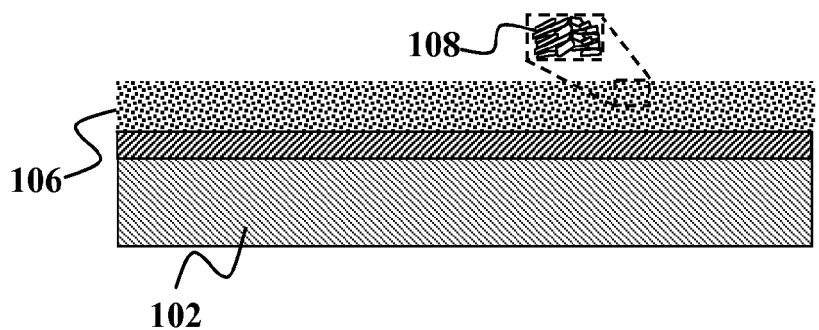

Referring now to FIG. 1B, a precursor layer 106 is formed over the substrate 102 by coating the substrate 102 with a dispersion such as but not limited to an ink. As one nonlimiting example, the ink may comprise of a carrier liquid mixed with the nanoflakes 108 and has a rheology that allows the ink to be coatable over the substrate 102. In on embodiment, the present invention may use dry powder mixed with the vehicle and sonicated before coating. Optionally, the inks may already formulated coming right from the mill. In the case of mixing, a plurality of flake compositions, the product may be mixed from various mills. This mixing could be sonicated but other forms of agitation and/or another mill may be used. The ink used to form the precursor layer 106 may contain non-spherical particles 108 such as but not limited to nanoflakes. It should also be understood that the ink may optionally use both non-spherical and spherical particles in any of a variety of relative proportions.

FIG. 1B includes a close-up view of the nanoflakes 108 in the precursor layer 106, as seen in the enlarged image. Nanoflakes have non-spherical shapes and are substantially planar on at least one side. A more detailed view of one embodiment of the nanoflakes 108 can be found in FIGS. 2A and 2B. Nanoflakes may be defined as particles having at least one substantially planar surface with a length and/or largest lateral dimension of about 500 nm or less and the particles has an aspect ratio of about 2 or more. In one embodiment, the length and/or largest lateral dimension is between about 400 nm and about 1 nm. In another embodiment, the length and/or largest lateral dimension is between about 300 nm and about 10 nm. In another embodiment, the length and/or largest lateral dimension is between about 200 nm and about 20 nm. In another embodiment, the length and/or largest lateral dimension is between about 500 nm and about 200 nm. In other embodiments, the nanoflake is a substantially planar structure with thickness of between about 10 and about 100 nm and lengths between about 20 nm and 500 nm.

It should be understood that different types of nanoflakes 108 may be used to form the precursor layer 106. In one nonlimiting example, the nanoflakes are elemental nanoflakes, i.e., nanoflakes having only a single atomic species. The nanoflakes may be single metal particles of Cu, Ga, In or Se. Some inks may have only one type of nanoflakes. Other inks may have two or more types of nanoflakes which may differ in material composition and/or other quality such as but not limited to shape, size, interior architecture (e.g. a central core surrounded by one or more shell layers), exterior coating (be more explanatory on this one, maybe use words like core-shell), or the like. In one embodiment, the ink used for precursor layer 106 may contain nanoflakes comprising one or more group IB elements and nanoflakes comprising one or more different group IIIA elements. Preferably, the precursor layer (106) contains copper, indium and gallium. In another embodiment, the precursor layer 106 may be an oxygen-free layer containing copper, indium and gallium. Optionally, the ratio of elements in the precursor layer may be such that the layer, when processed, forms a compound of $CuIn_xGa_{1-x}$, where $0 \leq x \leq 1$. Those of skill in the art will recognize that other group IB elements may be substituted for Cu and other group IIIA elements may be substituted for In and Ga. Optionally, the precursor may contain Se as well, such as but not limited to Cu—In—Ga—Se plates. This is feasible if the precursor is oxygen-free and densification is not needed. In still further embodiments, the precursor material may contain nanoflakes of group IB, IIIA, and VIA elements. In one nonlimiting example, the precursor may contain Cu—In—Ga—Se nanoflakes, which would be particularly advantageous if the nanoflakes are formed air free and densification prior to film formation is not needed.

Optionally, the nanoflakes 108 in the ink may be alloy nanoflakes. In one nonlimiting example, the nanoflakes may be binary alloy nanoflakes such as Cu—In, In—Ga, or Cu—Ga. Alternatively, the nanoflakes may be a binary alloy of group IB, IIIA elements, a binary alloy of Group IB, VIA elements, and/or a binary alloy of group IIIA, VIA elements. In other embodiments, the particles may be a ternary alloy of group IB, IIIA, and/or VIA elements. For example, the particles may be ternary alloy particles of any of the above elements such as but not limited to Cu—In—Ga. In other embodiments, the ink may contain particles that are a quaternary alloy of group IB, IIIA, and/or VIA elements. Some embodiments may have quaternary or multinary nanoflakes. The ink may also combine nanoflakes of different classes such as but not limited to elemental nanoflakes with alloy nanoflakes or the like. In one embodiment, the nanoflakes used to form the precursor layer 106 preferably contains no oxygen other than those amounts unavoidably present as impurities. Optionally, the microflakes contain less than about 0.1 wt % of oxygen. In other embodiments, the microflakes contain less than about 0.5 wt % of oxygen. In still further embodiments, the microflakes contain less than about 1.0 wt % of oxygen. In yet another embodiment, the microflakes contain less than about 3.0 wt % of oxygen. In other embodiments, the microflakes contain less than about 5.0 wt % of oxygen.

Optionally, the nanoflakes 108 in the ink may be chalcogenide particles, such as but not limited to, a group IB or group IIIA selenide. In one nonlimiting example, the nanoflakes may be a group IB-chalcogenide formed with one or more elements of group IB (new-style: group 11), e.g., copper (Cu), silver (Ag), and gold (Au). Examples include, but are not limited to, $Cu_xSe_y$, wherein x is in the range of about 1 to 10 and y is in the range of about 1 to 10. In some embodiments of the present invention, x<y. Alternatively, some embodiments may have selenides that are more selenium rich, such as but not limited to, $Cu_1Se_x$ (where x>1). This may provide an increased source of selenium as discussed in commonly assigned, co-pending U.S. patent application Ser. No. 13/361,522 filed on Feb. 22, 2006 and fully incorporated herein by reference. In another nonlimiting example, the nanoflakes may be a group IIIA-chalcogenide formed with one or more elements of group IIIA (new style: group 16), e.g., aluminum (Al), indium (In), gallium (Ga), and thallium (Tl). Examples include $In_xSe_y$ and $Ga_xSe_y$, wherein x is in the range of about 1 to about 10 and y is in the range of about 1 to about 10. Still further, the nanoflakes may be a Group IB-IIIA-chalcogenide compound of one or more group IB elements, one or more group IIIA elements and one or more chalcogens. Examples include $CuInGa-Se_2$. Other embodiments may replace the selenide component with another group VIA element such as but not limited to sulfur, or combinations of multiple group VIA elements such as both sulfur and selenium.

It should be understood that the ink used in the present invention may include more than one type of chalcogenide nanoflakes. For example, some may include nanoflakes from both group IB-chalcogenide(s) and group IIIA-chalcogenide(s). Others may include nanoflakes from different group IB-chalcogenides with different stoichiometric ratios. Others may include nanoflakes from different group IIIA-chalcogenides with different stoichiometric ratios.

Optionally, the nanoflakes 108 in the ink may also be particles of at least one solid solution. In one nonlimiting example, the nano-powder may contain copper-gallium solid solution particles, and at least one of indium particles, indium-gallium solid-solution particles, copper-indium solid solution particles, and copper particles. Alternatively, the nano-powder may contain copper particles and indium-gallium solid-solution particles.

One of the advantages of using nanoflake-based dispersions is that it is possible to vary the concentration of the elements within the precursor layer 106 from top to bottom by building the precursor layer in a sequence of thinner sub-layers, which when combined, form the precursor layer. The material may be deposited to form the first, second layer or subsequent sub-layers, and reacted in at least one suitable atmosphere to form the corresponding component of the active layer. In other embodiment, the sub-layers may be reacted as the sub-layers are deposited. The relative elemental concentration of the nanoflakes that make up the ink for each sub-layer may be varied. Thus, for example, the concentration of gallium within the absorber layer may be varied as a function of depth within the absorber layer. The precursor layer 106 (or selected constituent sub-layers, if any) may be deposited using a precursor material formulated with a controlled overall composition having a desired stoichiometric ratio. More details on one method of building a layer in a sequence of sub-layers can be found in commonly assigned, copending U.S. patent application Ser. No. 11/243,492 filed Oct. 3, 2005 and fully incorporated herein by reference for all purposes.

It should be understood that the film may be a layer made from a dispersion, such as but not limited to an ink, paste, or paint. A layer of the dispersion can be spread onto the substrate and annealed to form the precursor layer 106. By way of example the dispersion can be made by forming oxygen-free nanoflakes containing elements from group IB, group IIIA and intermixing these nanoflakes and adding them to a vehicle, which may encompass a carrier liquid (such as but not limited to a solvent), and any additives.

Generally, an ink may be formed by dispersing the nanoflakes in a vehicle containing a dispersant (e.g., a surfactant or polymer) along with (optionally) some combination of other components commonly used in making inks. In some embodiments of the present invention, the ink is formulated without a dispersant or other additives. The carrier liquid may be an aqueous (water-based) or non-aqueous (organic) solvent. Other components include, without limitation, dispersing agents, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the nanoflake dispersion. An alternative method to mixing nanoflakes and subsequently preparing a dispersion from these mixed nanoflakes would be to prepare separate dispersions for each individual type of nanoflake and subsequently mixing these dispersions. It should be understood that, due to favorable interaction of the planar shape of the nanoflakes with the carrier liquid, some embodiments of the ink may be formulated by use of a carrier liquid and without a dispersing agent.

The precursor layer 106 from the dispersion may be formed on the substrate 102 by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies.

In some embodiments, extra chalcogen, alloys particles, or elemental particles, e.g., micron- or sub-micron-sized chalcogen powder may be mixed into the dispersion containing the nanoflakes so that the nanoflakes and extra chalcogen are deposited at the same time. Alternatively the chalcogen powder may be deposited on the substrate in a separate solution-based coating step before or after depositing the dispersion containing the nanoflakes. In other embodiment, group IIIA elemental material such as but not limited to gallium droplets may be mixed with the flakes. This is more fully described in commonly assigned, copending U.S. patent application Ser. No. 13/361,522 filed on Feb. 22, 2006 and fully incorporated herein by reference. This may create an additional layer 107 (shown in phantom in FIG. 1C). Optionally, additional chalcogen may be added by any combination of (1) any chalcogen source that can be solution-deposited, e.g. a Se or S nano- or micron-sized powder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) an organo-selenium atmosphere, e.g. diethylselenide or another organo-metallic material, (7) another reducing atmosphere, e.g. CO, and a (8) heat treatment. The stoichiometric ratio of nanoflakes to extra chalcogen, given as Se/(Cu+In+Ga+Se) may be in the range of about 0 to about 1000.

Note that the solution-based deposition of the proposed mixtures of nanoflakes does not necessarily have to be performed by depositing these mixtures in a single step. In some embodiments of the present invention, the coating step may be performed by sequentially depositing nanoflake dispersions having different compositions of IB-, IIIA- and chalcogen-based particulates in two or more steps. For example, the method may be to first deposit a dispersion containing an indium selenide nanoflake (e.g. with an In-to-Se ratio of ~1), and subsequently deposit a dispersion of a copper selenide nanoflake (e.g. with a Cu-to-Se ratio of ~1) and a gallium selenide nanoflake (e.g. with a Ga-to-Se ratio of ~1) followed optionally by depositing a dispersion of Se. This would result in a stack of three solution-based deposited layers, which may be sintered together. Alternatively, each layer may be heated or sintered before depositing the next layer. A number of different sequences are possible. For example, a layer of $In_xGa_ySe_z$ with x≥0 (larger than or equal to zero), y≥0 (larger than or equal to zero), and z≥0 (larger than or equal to zero), may be formed as described above on top of a uniform, dense layer of $Cu_wIn_xGa_y$ with w≥0 (larger than or equal to zero), x≥0 (larger than or equal to zero), and y≥0 (larger than or equal to zero), and subsequently converting (sintering) the two layers into CIGS. Alternatively a layer of $Cu_wIn_xGa_y$ may be formed on top of a uniform, dense layer of $In_xGa_ySe_z$ and subsequently converting (sintering) the two layers into CIGS.

In alternative embodiments, nanoflake-based dispersions as described above may further include elemental IB, and/or IIIA nanoparticles (e.g., in metallic form). These nanoparticles may be in nanoflake form, or optionally, take other shapes such as but not limited to spherical, spheroidal, oblong, cubic, or other non-planar shapes. These particles may also include emulsions, molten materials, mixtures, and the like, in addition to solids. For example $Cu_xIn_yGa_zSe_u$ materials, with u>0 (larger than zero), with x≥0 (larger than or equal to zero), y≥0 (larger than or equal to zero), and z≥0 (larger than or equal to zero), may be combined with an additional source of selenium (or other chalcogen) and metallic gallium into a dispersion that is formed into a film on the substrate by sintering. Metallic gallium nanoparticles and/or nanoglobules and/or nanodroplets may be formed, e.g., by initially creating an emulsion of liquid gallium in a solution. Gallium metal or gallium metal in a solvent with or without emulsifier may be heated to liquefy the metal, which is then sonicated and/or otherwise mechanically agitated in the presence of a solvent. Agitation may be carried out either mechanically, electromagnetically, or acoustically in the presence of a solvent with or without a surfactant, dispersant, and/or emulsifier. The gallium nanoglobules and/or nanodroplets can then be manipulated in the form of a solid-particulate, by quenching in an environment either at or below room temperature to convert the liquid gallium nanoglobules into solid gallium nanoparticles. This technique is described in detail in commonly-assigned U.S. patent application Ser. No. 11/081,163 to Matthew R. Robinson and Martin R. Roscheisen entitled "Metallic Dispersion", the entire disclosures of which are incorporated herein by reference.

Note that the method may be optimized by using, prior to, during, or after the solution deposition and/or sintering of one or more of the precursor layers, any combination of (1) any chalcogen source that can be solution-deposited, e.g. a Se or S nanopowder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5), an organo-selenium containing atmosphere, e.g. diethylselenide (6) an $H_2$ atmosphere, (7) another reducing atmosphere, e.g. CO, (8) a wet chemical reduction step, and a (9) heat treatment.

Figure 1C:
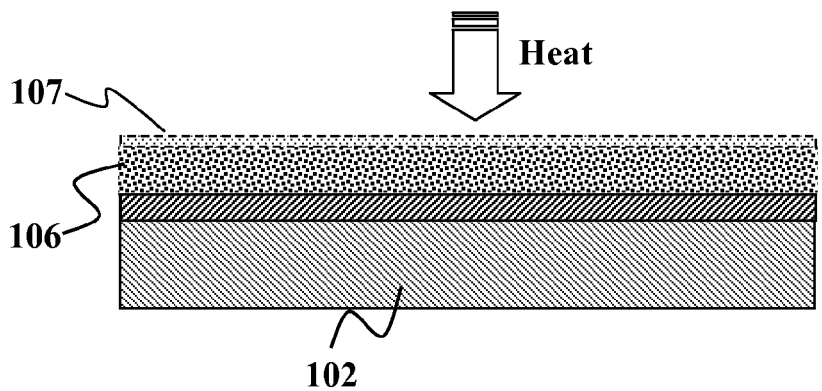

Referring now to FIG. 1C, the precursor layer 106 may then be processed in a suitable atmosphere to form a film. The film may be a dense film. In one embodiment, this involves heating the precursor layer 106 to a temperature sufficient to convert the ink (as-deposited ink. Note that solvent and possibly dispersant have been removed by drying). The temperature may be between about 375° C. and about 525° C. (a safe temperature range for processing on aluminum foil or high-temperature polymer substrates). The processing may occur at various temperatures in the range, such as but not limited to 450° C. In other embodiments, the temperature at the substrate may be between about 400° C. and about 600° C. at the level of the precursor layer, but cooler at the substrate. The time duration of the processing may also be reduced by at least about 20% if certain steps are removed. The heating may occur over a range between about four minutes to about ten minutes. In one embodiment, the processing comprises heating the precursor layer to a temperature greater than about 375° C. but less than a melting temperature of the substrate for a period of less than about 15 minutes. In another embodiment, the processing comprises heating the precursor layer to a temperature greater than about 375° C. but less than a melting temperature of the substrate for a period of about 1 minute or less. In a still further embodiment, the processing comprises heating the precursor layer to an annealing temperature but less than a melting temperature of the substrate for a period of about 1 minute or less. The processing step may also be accelerated via thermal processing techniques using at least one of the following processes: pulsed thermal processing, exposure to laser beams, or heating via IR lamps, and/or similar or related processes.

Although pulsed thermal processing remains generally promising, certain implementations of the pulsed thermal processing such as a directed plasma arc system, face numerous challenges. In this particular example, a directed plasma arc system sufficient to provide pulsed thermal processing is an inherently cumbersome system with high operational costs. The direct plasma arc system requires power at a level that makes the entire system energetically expensive and adds significant cost to the manufacturing process. The directed plasma arc also exhibits long lag time between pulses and thus makes the system difficult to mate and synchronize with a continuous, roll-to-roll system. The time it takes for such a system to recharge between pulses also creates a very slow system or one that uses more than directed plasma arc, which rapidly increase system costs.

In some embodiments of the present invention, other devices suitable for rapid thermal processing may be used and they include pulsed layers used in adiabatic mode for annealing (Shtyrokov E I, *Sov. Phys.-Semicond.* 9 1309), continuous wave lasers (10-30 W typically) (Ferris S D 1979 *Laser-Solid Interactions and Laser Processing* (New York: AIP)), pulsed electron beam devices (Kamins T I 1979 *Appl. Phys. Leti.* 35 282-5), scanning electron beam systems (McMahon R A 1979 *J. Vac. Sci. Techno.* 16 1840-2) (Regolini J L 1979 *Appl. Phys. Lett.* 34 410), other beam systems (Hodgson R T 1980 *Appl. Phys. Lett.* 37 187-9), graphite plate heaters (Fan J C C 1983 *Mater. Res. Soc. Proc.* 4 751-8) (M W Geis 1980 *Appl. Phys. Lett.* 37 454), lamp systems (Cohen R L 1978 *Appl. Phys. Lett.* 33 751-3), and scanned hydrogen flame systems (Downey D F 1982 *Solid State Technol.* 25 87-93). In some embodiment of the present invention, non-directed, low density system may be used. Alternatively, other known pulsed heating processes are also described in U.S. Pat. Nos. 4,350, 537 and 4,356,384. Additionally, it should be understood that methods and apparatus involving pulsed electron beam processing and rapid thermal processing of solar cells as described in expired U.S. Pat. No. 3,950,187 ("Method and apparatus involving pulsed electron beam processing of semiconductor devices") and U.S. Pat. No. 4,082,958 ("Apparatus involving pulsed electron beam processing of semiconductor devices") are in the public domain and well known. U.S. Pat. No. 4,729,962 also describes another known method for rapid thermal processing of solar cells. The above may be applied singly or in single or multiple combinations with the above or other similar processing techniques with various embodiments of the present invention.

It should be noted that using nanoflakes typically results in precursor layers that sinter into a solid layer at temperatures as much as 50° C. lower than a corresponding layer of spherical nanoparticles. This is due in part because of the greater surface area contact between particles.

In certain embodiments of the invention, the precursor layer 106 (or any of its sub-layers) may be annealed, either sequentially or simultaneously. Such annealing may be accomplished by rapid heating of the substrate 102 and precursor layer 106 from an ambient temperature to a plateau temperature range of between about 200° C. and about 600° C. The temperature is maintained in the plateau range for a period of time ranging between about a fraction of a second to about 60 minutes, and subsequently reduced. Alternatively, the annealing temperature could be modulated to oscillate within a temperature range without being maintained at a particular plateau temperature. This technique (referred to herein as rapid thermal annealing or RTA) is particularly suitable for forming photovoltaic active layers (sometimes called "absorber" layers) on metal foil substrates, such as but not limited to aluminum foil. Other suitable substrates include but are not limited to other metals such as Stainless Steel, Copper, Titanium, or Molybdenum, metallized plastic foils, glass, ceramic films, and mixtures, alloys, and blends of these and similar or related materials. The substrate may be flexible, such as the form of a foil, or rigid, such as the form of a plate, or combinations of these forms. Additional details of this technique are described in U.S. patent application Ser. No. 10/943,685, which is incorporated herein by reference.

The atmosphere associated with the annealing step may also be varied. In one embodiment, the suitable atmosphere comprises a hydrogen atmosphere. However, in other embodiments where very low or no amounts of oxygen are found in the nanoflakes, the suitable atmosphere may be a nitrogen atmosphere, an argon atmosphere, a carbon monoxide atmosphere, or an atmosphere having less than about 10% hydrogen. These other atmospheres may be advantageous to enable and improve material handling during production.

Figure 1D:
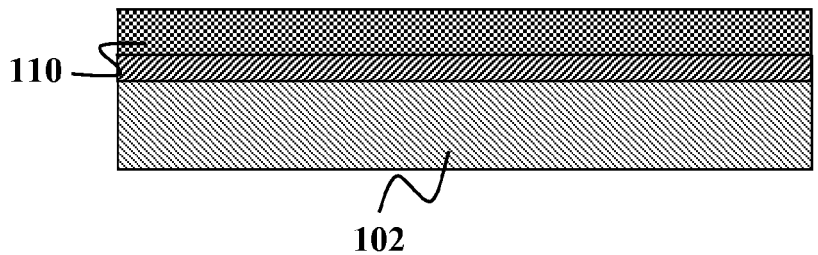

Referring now to FIG. 1D, the precursor layer 106 is processed to form the dense film 110. The dense film 110 may actually have a reduced thickness than the thickness of the wet precursor layer 106 since the carrier liquid and other materials have been removed during processing. In one embodiment, the film 110 may have a thickness in the range of about 0.5 microns to about 2.5 microns. In other embodiments, the thickness of film 110 may be between about 1.5 microns and about 2.25 microns. In one embodiment, the resulting dense film 110 may be substantially void free. In some embodiments, the dense film 110 has a void volume of about 5% or less. In other embodiments, the void volume is about 10% or less. In another embodiment, the void, volume is about 20% or less. In still other embodiments, the void volume is about 24% or less. In still other embodiments, the void volume is about 30% or less. The processing of the precursor layer 106 will fuse the nanoflakes together and in most instances, remove void space and thus reduce the thickness of the resulting dense film.

Nanoflakes

Figure 2A:
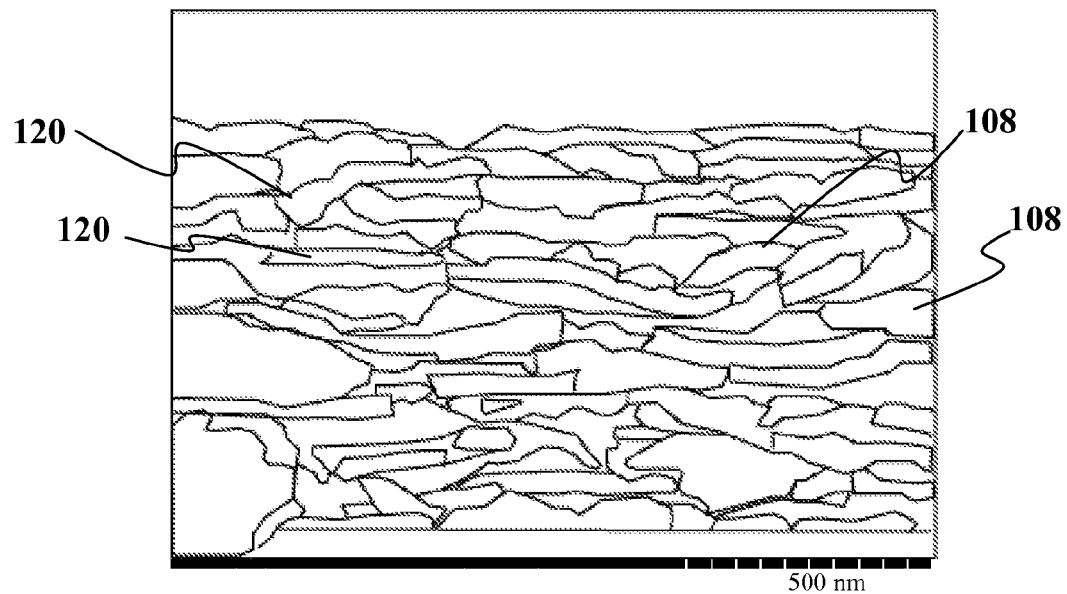
FIGS. 2A and 2B are magnified side view and magnified top-down view of nanoflakes according to one embodiment of the present invention.
Figure 2B:
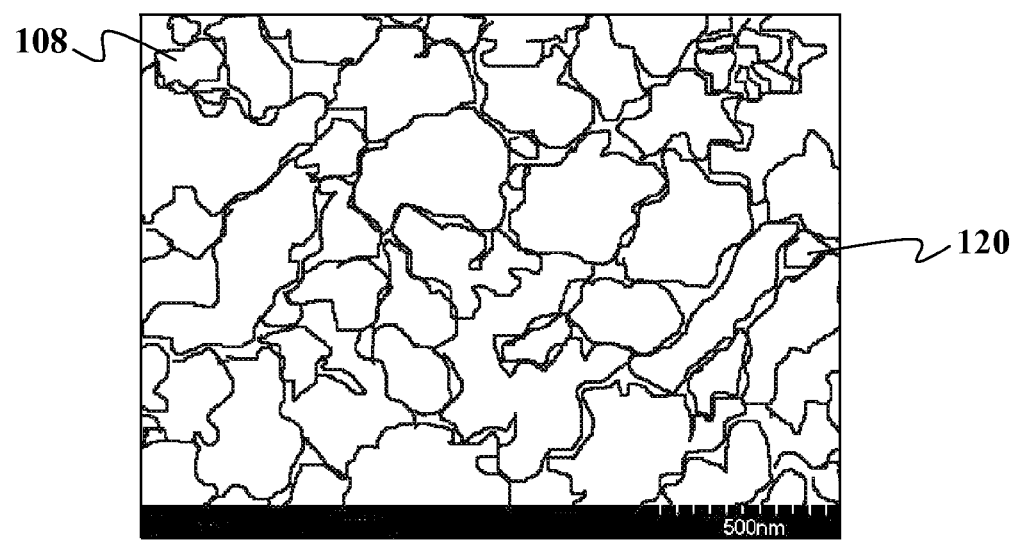

Referring now to FIGS. 2A and 2B, embodiments of the nanoflakes 108 according to the present invention will be described in further detail. The nanoflakes 108 may come in a variety of shapes and sizes. In one embodiment, the nanoflakes 108 may have a large aspect ratio, in terms of particle thickness to particle length. FIG. 2A shows the density of the particle packing FIG. 2A shows that some nanoflakes have thicknesses between about 20 to about 100 nm. Some may have a length of about 500 nm or less. The aspect ratio in some embodiments of nanoflakes may be about 10:1 or more (ratio of the longest dimension to the shortest dimension of a particle). Other embodiments may have an aspect ratio of about 30:1 or more. Still others may have an aspect ratio of about 50:1 or more. An increase in aspect ratio would indicate that the longest dimension has increased over the shortest dimension or that the shortest dimension has decreased relative to the longest dimension. Thus, aspect ratio herein involves the longest lateral dimension (be it length or width) relative to the shortest dimension, which is typically the thickness of a flake. The dimensions are measured along edges or across a major axis to provide measurement of dimensions such as but not limited to length, width, depth, and/or diameter. When referring to a plurality of nanoflakes having a defined aspect ratio, what is meant is that all of the nanoflakes of a composition as a whole have an average aspect ratio as defined. It should be understood that there may be a distribution of particle aspect ratios around the average aspect ratio.

As seen in FIG. 2A, although the size and shape of the nanoflakes 108 may vary, most include at least one substantially planar surface 120. The at least one planar surface 120 allows for greater surface contact between adjacent nanoflakes 108. The greater surface contact provides a variety of benefits. The greater contact allows for improved atomic intermixing between adjacent particles. For nanoflakes containing more than one element, even though there may be atomic intermixing already in place for the particles, the close contact in the film allows easy subsequent diffusion. Thus, if a particle is slightly rich in one element, the increased contact facilitates a more even distribution of elements in the resulting dense film. Furthermore, greater interparticle interfacial area leads to faster reaction rates. The planar shape of the particles maximizes interparticle contact area. The interparticle contact area allows chemical reactions (e.g. based for example upon atomic diffusion) to be initiated, catalyzed, and/or progress relatively rapidly and concurrently over large areas. Thus, not only does the shape improve intermixing, the greater interfacial area and interparticle contact area also improves reaction rates.

Referring still to FIG. 2A, the planar shape also allows for improved packing density. As seen in FIG. 2A, the nanoflakes 108 may be oriented substantially parallel to the surface of substrate 102 and stack one on top of the other to form the precursor layer 106. Intrinsically, the geometry of the nanoflakes allow for more intimate contact than spherical particles or nanoparticles in the precursor layer. In fact, it is possible that 100% of the planar surface of the nanoflake is in contact with another nanoflake. Thus, the planar shape of the nanoflakes creates a higher packing density in the dense film as compared to a film made from a precursor layer using an ink of spherical nanoparticles of the same composition that is otherwise substantially identical. In some embodiments, the planar shape of the nanoflakes creates a packing density of at least about 70% in the precursor layer. In other embodiments, the nanoflakes create a packing density of at least about 80% in the precursor layer. In other embodiments, the nanoflakes create a packing density of at least about 90% in the precursor layer. In other embodiments, the nanoflakes create a packing density of at least about 95% in the precursor layer.

Figure 2C:
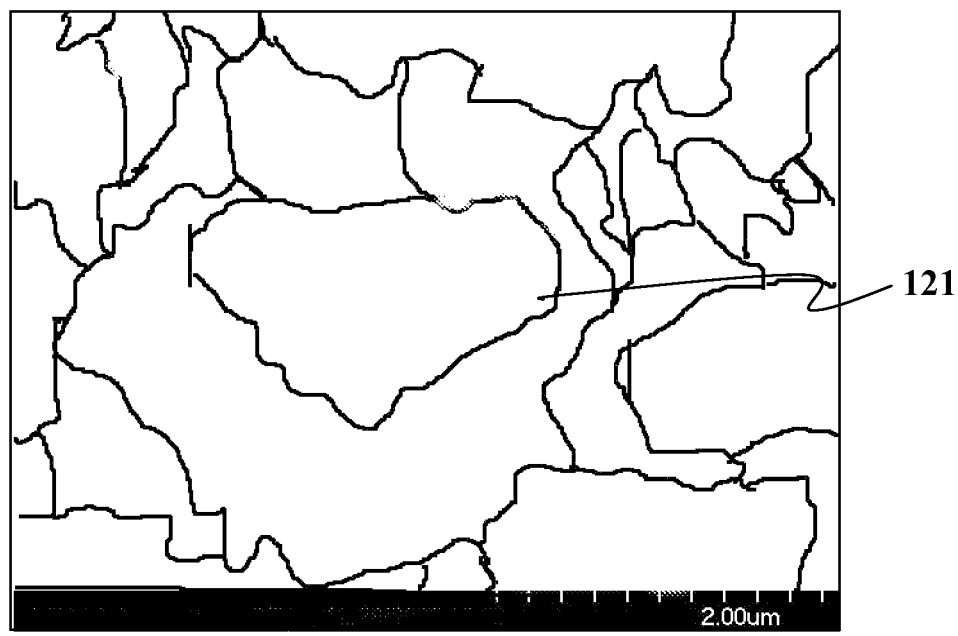
FIG. 2C is a magnified top-down view of microflakes according to one embodiment of the present invention.

As seen in FIG. 2B, the nanoflakes 108 may have a variety of shapes. In some embodiments, the nanoflakes in the ink may include those that are of random size and/or random shape. On the contrary, particles size is extremely important for standard spherical nanoparticles, and those spherical nanoparticles of different size and composition will result in dispersion with unstable atomic composition. The planar surface 120 of the nanoflakes allows for particles that are more easily suspended in the carrier liquid. Thus, even though the nanoflakes may not be monodisperse in size, putting the constituent metals in plate form provides one method to have particles suspended in the carrier liquid without rapid and/or preferential settling of any constituent element. Additionally, FIG. 2C is a magnified top-down view of microflakes 121 according to one embodiment of the present invention It should be understood that the nanoflakes 108 of the present invention may be formed and/or size discriminated to provide a more controlled size and shape distribution. The size distribution of nanoflakes may be such that one standard deviation from a mean length and/or width of the nanoflakes is less than about 250 nm. In another embodiment, the size distribution of nanoflakes may be such that one standard deviation from a mean length and/or width of the nanoflakes is less than about 200 nm. In another embodiment, the size distribution of nanoflakes may be such that one standard deviation from a mean length and/or width of the nanoflakes is less than about 150 nm. In another embodiment, the size distribution of nanoflakes may be such that one standard deviation from a mean length and/or width of the nanoflakes is less than about 100 nm. In another embodiment, one standard deviation from a mean length of the nanoflakes is less than about 50 nm. In yet another embodiment, one standard deviation from a mean thickness of the nanoflakes is less than about 10 nm. In another embodiment of the invention, one standard deviation from a mean thickness of the nanoflakes is less than about 5 nm. The nanoflakes each have a thickness less than about 250 nm. In another embodiment, the nanoflakes each have a thickness less than about 100 nm. In another embodiment, the nanoflakes each have a thickness less than about 50 nm. In yet another embodiment, the nanoflakes each have a thickness less than about 20 nm. In terms of their shape, the nanoflakes may have an aspect ratio of at least about 10 or more. In another embodiment, the nanoflakes have an aspect ratio of at least about 15 or more. The nanoflakes are of random planar shape and/or a random size distribution. In other embodiments, the nanoflakes are of non-random planar shape and/or a non-random size distribution.

The stoichiometric ratio of elements may vary between individual nanoflakes so long as the overall amount in all of the particles combined is at the desired or close to the desired stoichiometric ratio for the precursor layer and/or resulting dense film. According to one preferred embodiment of that process, the overall amount of elements in the resulting film has a Cu/(In+Ga) compositional range of about 0.7 to about 1.0 and a Ga/(In+Ga) compositional range of about 0.05 to about 0.30. Optionally, the Se/(In+Ga) compositional range may be about 0.00 to about 4.00 such that a later step involving use of an additional source of Se may or may not be required.

Nanoflake Formation

Figure 3:
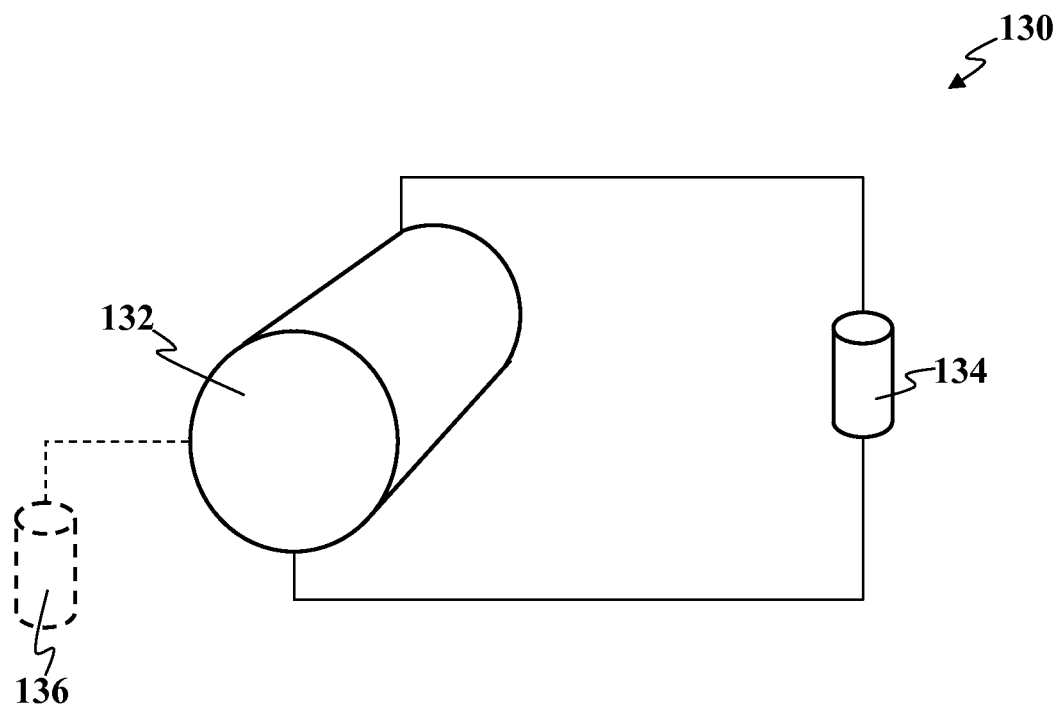
FIG. 3 shows a schematic of a milling system according to the one embodiment of the present invention.

Referring now to FIG. 3, one embodiment of a device for forming nanoflakes 108 will now be described. Nanoflakes 108 may be obtained by a variety of techniques including, but not limited to, size reducing techniques like ball milling, bead milling, small media milling, agitator ball milling, planetary milling, horizontal ball milling, pebble milling, pulverizing, hammering, dry grinding, wet grinding, jet milling, or other types of milling, applied singly or in any combination, on a commercially available feedstock of the desired elemental, binary, ternary, or multi-nary material. FIG. 3 shows one embodiment of a milling system 130 using a milling machine 132 that contains the balls or beads, or other material used in the milling process. The system 130 may be a closed system to provide an oxygen-free environment for processing of the feedstock material. A source of inert gas 134 may be coupled to the closed system to maintain an oxygen-free environment.

The milling system 130 may also be configured to allow for cryomilling by providing a liquid nitrogen or other cooling source 136 (shown in phantom). Alternatively, the milling system 130 may also be configured to provide heating during the milling process. Cycles of heating and/or cooling can also be carried out during the milling process. Optionally, the milling may also involve mixing a carrier liquid and/or a dispersing agent with the powder or feedstock being processed. In one embodiment of the present invention, the nanoflakes 108 created by milling may be of a variety of sizes such as but not limited to, about 20 nanometers to about 500 nanometers in thickness. In another embodiment, the nanoflakes may be between about 75 nanometers to 100 nanometers in thickness.

It should be understood that the milling may use beads or microbeads made of materials harder and/or having a higher mass density than the feedstock particles to transform the feedstock particles to the appropriate size and shape. In one embodiment, these beads are glass, ceramic, alumina, porcelain, silicon carbide, or tungsten carbide beads, stainless steel balls with ceramic shells, iron balls with ceramic shells, or the like to minimize contamination risk to the nanoflakes. The mill itself or parts of the mill may also have a ceramic lining or a lining of another inert material or parts of the mill may be completely ceramic or made chemically and mechanically inert to minimize contamination of the slurry containing the nanoflakes. The beads may also be sieved regularly during the process.

The ball milling may occur in an oxygen-free environment. This may involve using a mill that is sealed from the outside environment and purged of air. Milling may then occur under an inert atmosphere or other oxygen-free environment. Some embodiments may involve placing the mill inside a hood or chamber that provides the sealing for an oxygen-free environment. The process may involve drying and degassing the vehicle or choosing anhydrous, oxygen-free solvent to begin with and loading without contact to air. The oxygen-free milling may create oxygen-free nanoflakes which in turn reduces the need for a step to remove oxygen from the particles. This could significantly reduce the anneal time associated with turning the nanoflakes precursor layer into the dense film. In some embodiments, the anneal time is in the range of about 30 seconds. Related to air-free nanoflake creation (size reduction), it should be understood that the present invention may also include air-free dispersion creation, and air-free coating, storage and/or handling.

The milling may occur at a variety of temperatures. In one embodiment of the present invention, the milling occurs at room temperature. In another embodiment, the milling occurs at a cryogenic temperature such as but not limited to ≤−175° C. This may allow milling to work on particles that may be liquid or not sufficiently brittle at room temperature for size reduction. The milling may also occur at a desired milling temperature wherein all precursor particles are solids and the precursor particles have a sufficient malleability at the milling temperature to form the planar shape from the non-planar or planar starting shape. This desired temperature may be at room temperature, above room temperature, or below room temperature and/or cycle between various temperatures. In one embodiment, the milling temperature may be less than about 15 degrees C. In another embodiment, the temperature is at less than about −175 degrees C. In yet another embodiment, the milling may be cooled by liquid nitrogen which is 80K, being −193 C. Temperature control during milling may control possible chemical reaction between solvent, dispersant, feedstock material, and/or parts of the mill. It should be understood that in addition to the aforementioned, the temperature may also vary over different time periods of the milling process. As a nonlimiting example, the milling may occur at a first temperature over an initial milling time period and proceed to other temperatures for subsequent time periods during the milling.

The milling may transform substantially all of the precursor particles into nanoflakes. In some embodiments, the milling transforms at least about 50% (by weight of all of the precursor particles) of the precursor particles into nanoflakes. In other embodiments, it is at least 50% by volume of all the precursor particles being transformed to nanoflakes. Additionally, it should be understood that the temperature can be constant or changed during milling. This may be useful to adjust the material properties of the feedstock material or partially milled material to create particles of desired shape, size, and/or composition.

Although the present invention discloses a "top down" method for forming nanoflakes, it should be understood that other techniques may also be used. For example, quenching a material from the melt on a surface such as a liquid cooling bath. Indium (and likely gallium and selenium) nanoflakes may be formed by emulsifying molten indium while agitating and quenching at the surface of a cooling bath. It should be understood that any wet chemical, dry chemical, dry physical, and/or wet physical technique to make flakes can be used with the present invention (apart from dry or wet size reduction). Thus, the present invention is not limited to wet physical top-down methods (milling), but may also include dry/wet bottom-up approaches. It should also be noted that size reduction may optionally be a multi-step process. In one nonlimiting example, this may first involve taking mm-sized chunks/pieces that are dry grinded to <100 um, subsequently milled in one, two, three, or more steps with subsequent reducing bead size to the nanoflakes.

It should be understood that the feedstock particles for use with the present invention may be prepared by a variety of methods. By way of example and not limitation, U.S. Pat. No. 5,985,691 issued to B. M. Basol et al describes a particle-based method to form a Group IB-IIIA-VIA compound film. Eberspacher and Pauls in U.S. Pat. No. 6,821,559 describe a process for making phase-stabilized precursors in the form of fine particles, such as submicron multinary metal particles, and multi-phase mixed-metal particles comprising at least one metal oxide. Bulent Basol in U.S. Published Patent application number 20040219730 describes a process of forming a compound film including formulating a nano-powder material with a controlled overall composition and having particles of one solid solution. Using the solid-solution approach, Gallium can be incorporated into the metallic dispersion in non-oxide form—but only with up to approximately 18 relative atomic percent (Subramanian, P. R. and Laughlin, D. E., in *Binary Alloy Phase Diagrams, 2$^{nd}$ Edition*, edited by Massalski, T. B. 1990. ASM international, Materials Park, Ohio, pp 1410-1412; Hansen, M., *Constitution of Binary Alloys*. 1958. 2$^{nd}$ Edition, McGraw Hill, pp. 582-584.) U.S. patent application Ser. No. 11/081,163 describes a process of forming a compound film by formulating a mixture of elemental nanoparticles composed of the IB, the IIIA, and, optionally, the VIA group of elements having a controlled overall composition. Discussion on chalcogenide powders may also be found in the following: [(1) Vervaet, A. et al., E. C. Photovoltaic Sol. Energy Conf., Proc. Int. Conf., 10th (1991), 900-3; (2) Journal of Electronic Materials, Vol. 27, No. 5, 1998, p. 433; Ginley et al.; (3) WO 99,378,32; Ginley et al.; (4) U.S. Pat. No. 6,126,740]. These methods may be used to create feedstock to be size reduced. Others may form precursor sub-micron-sized particles ready for solution-deposition. All documents listed above are fully incorporated herein by reference for all purposes.

Ink Preparation

To formulate the dispersion used in the precursor layer 106, the nanoflakes 108 are mixed together and with one or more chemicals including but not limited to dispersants, surfactants, polymers, binders, cross-linking agents, emulsifiers, anti-foaming agents, dryers, solvents, fillers, extenders, thickening agents, film conditioners, anti-oxidants, flow agents, leveling agents, and corrosion inhibitors.

The inks created using the present invention may optionally include a dispersant. Some embodiments may not include any dispersants. Dispersants (also called wetting agents) are surface-active substances used to prevent particles from aggregating or flocculating, thus facilitating the suspension of solid materials in a liquid medium and stabilizing the dispersion thereby produced. If particle surfaces attract one another, then flocculation occurs, often resulting in aggregation and decreasing stability and/or homogeneity. If particle surfaces repel one another, then stabilization occurs, where particles do not aggregate and tend not to settle out of solution as fast.

An efficient dispersing agent can typically perform pigment wetting, dispersing, and stabilizing. Dispersing agents are different depending on the nature of the ink/paint. Polyphosphates, styrene-maleinates and polyacrylates are often used for aqueous formulations whereas fatty acid derivatives and low molecular weight modified alkyd and polyester resins are often used for organic formulations.

Surfactants are surface-active agents that lower the surface tension of the solvent in which they dissolve, serving as wetting agents, and keeping the surface tension of an (aqueous) medium low so that an ink interacts with a substrate surface. Certain types of surfactants are also used as dispersing agents. Surfactants typically contain both a hydrophobic carbon chain and a hydrophilic polar group. The polar group can be non-ionic. If the polar group is ionic, the charge can be either positive or negative, resulting in cationic or anionic surfactants. Zwitterionic surfactants contain both positive and negative charges within the same molecule; one example is N-n-Dodecyl-N,N-dimethyl betaine. Certain surfactants are often used as dispersant agents for aqueous solutions. Representative classes include acetylene diols, fatty acid derivatives, phosphate esters, sodium polyacrylate salts, polyacrylic acids, soya lecithin, trioctylphosphine (TOP), and trioctylphosphine oxide (TOPO).

Binders and resins are often used to hold together proximate particles in a nascent or formed dispersion. Examples of typical binders include acrylic monomers (both as monofunctional diluents and multifunctional reactive agents), acrylic resins (e.g. acrylic polyol, amine synergists, epoxy acrylics, polyester acrylics, polyether acrylics, styrene/acrylics, urethane acrylics, or vinyl acrylics), alkyd resins (e.g. long-oil, medium-oil, short-oil, or tall oil), adhesion promoters such as but not limited to polyvinyl pyrrolidone (PVP), amide resins, amino resins (such as but not limited to melamine-based or urea-based compounds), asphalt/bitumen, butadiene acrylonitriles, cellulosic resins (such as but not limited to cellulose acetate butyrate (CAB)), cellulose acetate proprionate (CAP), ethyl cellulose (EC), nitrocellulose (NC), or organic cellulose ester), chlorinated rubber, dimer fatty acids, epoxy resin (e.g. acrylates, bisphenol A-based resins, epoxy UV curing resins, esters, phenol and cresol (Novolacs), or phenoxy-based compounds), ethylene co-terpolymers such as ethylene acrylic/methacrylic Acid, E/AA, E/M/AA or ethylene vinyl acetate (EVA), fluoropolymers, gelatin (e.g. Pluronic F-68 from BASF Corporation of Florham Park, N.J.), glycol monomers, hydrocarbon resins (e.g. aliphatic, aromatic, or coumarone-based such as indene), maelic resins, modified urea, natural rubber, natural resins and gums, rosins, modified phenolic resins, resols, polyamide, polybutadienes (liquid hydroxyl-terminated), polyesters (both saturated and unsaturated), polyolefins, polyurethane (PU) isocyanates (e.g. hexamethylene diisocynate (HDI), isophorone diisocyanate (IPDI), cycloaliphatics, diphenylmethane disiocyanate (MDI), toluene diisocynate (TDI), or trimethylhexamethylene diisocynate (TMDI)), polyurethane (PU) polyols (e.g. caprolactone, dimer-based polyesters, polyester, or polyether), polyurethane (PU) dispersions (PUDs) such those based on polyesters or polyethers, polyurethane prepolymers (e.g. caprolactone, dimer-based polyesters, polyesters, polyethers, and compounds based on urethane acrylate), Polyurethane thermoplastics (TPU) such as polyester or polyether, silicates (e.g. alkyl-silicates or water-glass based compounds), silicones (amine functional, epoxy functional, ethoxy functional, hydroxyl functional, methoxy functional, silanol functional, or cinyl functional), styrenes (e.g. styrene-butadiene emulsions, and styrene/vinyl toluene polymers and copolymers), or vinyl compounds (e.g. polyolefins and polyolefin derivatives, polystyrene and styrene copolymers, or polyvinyl acetate (PVAC)).

Emulsifiers are dispersing agents that blend liquids with other liquids by promoting the breakup of aggregating materials into small droplets and therefore stabilize the suspension in solution. For example, sorbitan esters are used as an emulsifier for the preparation of water-in-oil (w/o) emulsions, for the preparation of oil absorption bases (w/o), for the formation of w/o type pomades, as a reabsorption agent, and as a non toxic anti-foaming agent. Examples of emulsifiers are sorbitan esters such as sorbitan sesquioleate (Arlacel 60), sorbitan sesquioleate (Arlacel 83), sorbitan monolaurate (Span 20), sorbitan monopalmitate (Span 40), sorbitan monostearate (Span 60), sorbitan tristearate (Span 65), sorbitan mono-oleate (Span 80), and sorbitan trioleate (Span 85) all of which are available, e.g., from Uniqema of New Castle, Del. Other polymeric emulsifiers include polyoxyethylene monostearate (Myrj 45), polyoxyethylene monostearate (Myrj 49), polyoxyl 40 stearate (Myrj 52), polyoxyethylene monolaurate (PEG 400), polyoxyethylene monooleate (PEG 400 monoleate) and polyoxyethylene monostearate (PEG 400 monostearate), and the Tween series of surfactants including but not limited to polyoxyethylene sorbitan monolaurate (Tween 20), polyoxyethylene sorbitan monolaurate (Tween 21), polyoxyethylene sorbitan monopalmitate (Tween 40), polyoxyethylene sorbitan monostearate (Tween 60), polyoxyethylene sorbitan tristearate (Tween 61), polyoxyethylene sorbitan mono-oleate (Tween 80), polyoxyethylene sorbitan monooleate (Tween 81), and polyoxyethylene sorbitan tri-oleate (Tween 85) all of which are available, e.g., from Uniqema of New Castle, Del. Arlacel, Myrj, and Tween are registered trademarks of ICI Americas Inc. of Wilmington, Del.

Foam may form from the release of various Ga-Ses during the coating/printing process, especially if the printing process takes place at high speeds. Surfactants may adsorb on the liquid-air interface and stabilize it, accelerating foam formation. Anti-foaming agents prevent foaming from being initiated, while defoaming agents minimize or eliminate previously-formed foam. Anti-foaming agents include hydrophobic solids, fatty oils, and certain surfactants, all of which penetrate the liquid-air interface to slow foam formation. Anti-foaming agents also include both silicate, silicone and silicone-free materials. Silicone-free materials include microcrystalline wax, mineral oil, polymeric materials, and silica- and surfactant-based materials.

Solvents can be aqueous (water-based) or non-aqueous (organic). While environmentally friendly, water-based solutions carry the disadvantage of a relatively higher surface tension than organic solvents, making it more difficult to wet substrates, especially plastic substrates. To improve substrate wetting with polymer substrates, surfactants may be added to lower the ink surface tension (while minimizing surfactant-stabilized foaming), while the substrate surfaces are modified to enhance their surface energy (e.g. by corona treatment). Typical organic solvents include acetate, acrylates, alcohols (butyl, ethyl, isopropyl, or methyl), aldehydes, benzene, dibromomethane, chloroform, dichloromethane, dichloroethane, trichloroethane, cyclic compounds (e.g. cyclopentanone or cyclohexanone), esters (e.g. butyl acetate or ethyl acetate), ethers, glycols (such as ethylene glycol or propylene glycol), hexane, heptane, aliphatic hydrocarbons, aromatic hydrocarbons, ketones (e.g. acetone, methyl ethyl ketone, or methyl isobutyl ketone), natural oils, terpenes, terpinol, toluene.

Additional components may include fillers/extenders, thickening agents, rheology modifiers, surface conditioners, including adhesion promoters/bonding, anti-gelling agents, anti-blocking agents, antistatic agents, chelating/complexing agents, corrosion inhibitors, flame/rust inhibitors, flame and fire retardants, humectants, heat stabilizers, light-stabilizers/UV absorbers, lubricants, pH stabilizers, and materials for slip control, anti-oxidants, and flow and leveling agents. It should be understood that all components may be added singly or in combination with other components.

Roll-To-Roll Manufacturing

Figure 4:
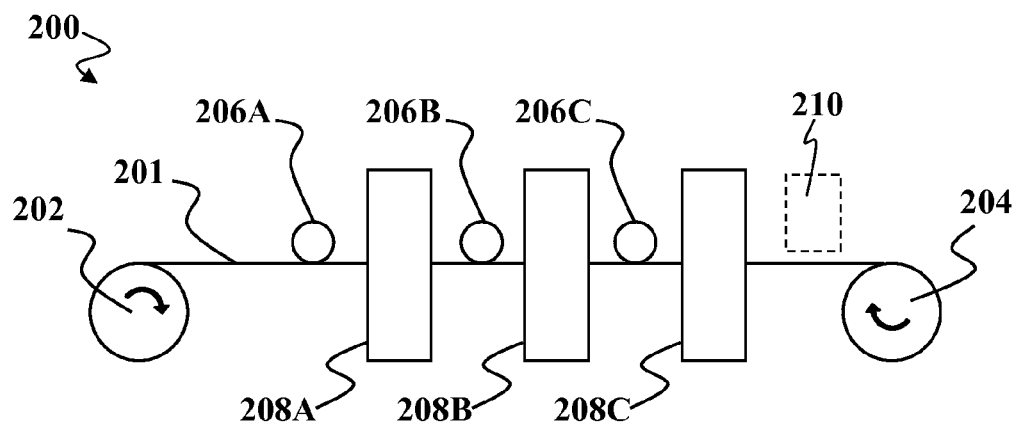
FIG. 4 shows a schematic of a roll-to-roll manufacturing system according to the one embodiment of the present invention.

Referring now to FIG. 4, a roll-to-roll manufacturing process according to the present invention will now be described. Embodiments of the invention using the nanoflakes are well suited for use with roll-to-roll manufacturing. Specifically, in a roll-to-roll manufacturing system 200 a flexible substrate 201, e.g., aluminum foil travels from a supply roll 202 to a take-up roll 204. In between the supply and take-up rolls, the substrate 201 passes a number of applicators 206A, 206B, 206C, e.g. microgravure rollers and heater units 208A, 208B, 208C. Each applicator deposits a different layer or sub-layer of a precursor layer, e.g., as described above. The heater units are used to anneal the different layers and/or sub-layers to form dense films. In the example depicted in FIG. 4, applicators 206A and 206B may apply different sub-layers of a precursor layer (such as precursor layer 106). Heater units 208A and 208B may anneal each sub-layer before the next sub-layer is deposited. Alternatively, both sub-layers may be annealed at the same time. Applicator 206C may optionally apply an extra layer of material containing chalcogen or alloy or elemental particles as described above. Heater unit 208C heats the optional layer and precursor layer as described above. Note that it is also possible to deposit the precursor layer (or sub-layers) then deposit any additional layer and then heat all three layers together to form the IB-IIIA-chalcogenide compound film used for the photovoltaic absorber layer. The roll-to-roll system may be a continuous roll-to-roll and/or segmented roll-to-roll, and/or batch mode processing roll-to-roll system.

Photovoltaic Device

Figure 5:
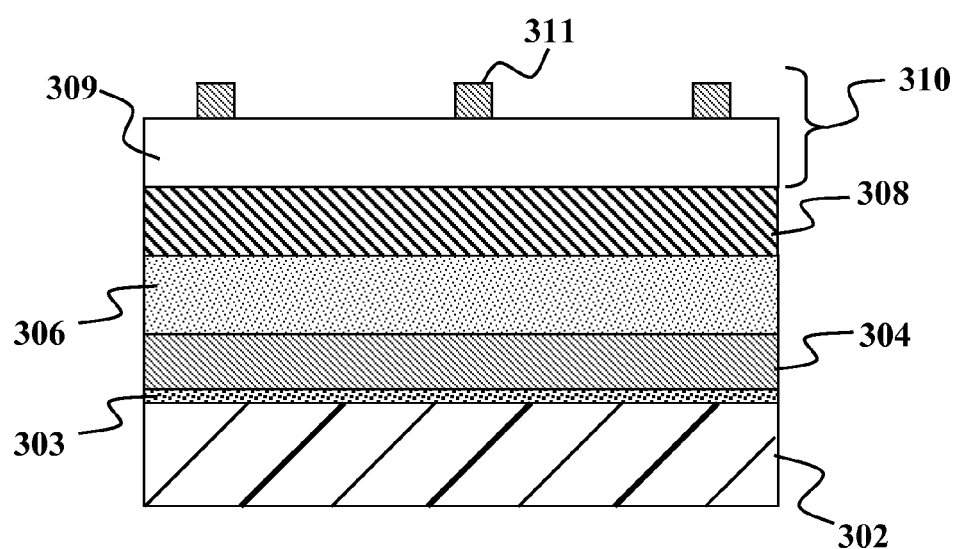
FIG. 5 shows a cross-sectional view of a photovoltaic device according to one embodiment of the present invention.

Referring now to FIG. 5, the films fabricated as described above may serve as an absorber layer in a photovoltaic device, module, or solar panel. An example of such a photovoltaic device 300 is shown in FIG. 4. The device 300 includes a base substrate 302, an optional adhesion layer 303, a base or back electrode 304, a p-type absorber layer 306 incorporating a film of the type described above, a n-type semiconductor thin film 308 and a transparent electrode 310. By way of example, the base substrate 302 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, or a metallized plastic. By way of nonlimiting example, related polymers include those with similar structural and/or functional properties and/or material attributes. The base electrode 304 is made of an electrically conductive material. By way of example, the base electrode 304 may be of a metal layer whose thickness may be selected from the range of about 0.1 micron to about 25 microns. An optional intermediate layer 303 may be incorporated between the electrode 304 and the substrate 302. The transparent electrode 310 may include a transparent conductive layer 309 and a layer of metal (e.g., Al, Ag, Cu, or Ni) fingers 311 to reduce sheet resistance.

The n-type semiconductor thin film 308 serves as a junction partner between the compound film and the transparent conducting layer 309. By way of example, the n-type semiconductor thin film 308 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules Layers of these materials may be deposited, e.g., by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also configured for use in a continuous roll-to-roll and/or segmented roll-to-roll and/or a batch mode system.

The transparent conductive layer 309 may be inorganic, e.g., a transparent conductive oxide (TCO) such as but not limited to indium tin oxide (ITO), fluorinated indium tin oxide, zinc oxide (ZnO) or aluminum doped zinc oxide, or a related material, which can be deposited using any of a variety of means including but not limited to sputtering, evaporation, CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Combinations of inorganic and organic materials can also be used to form a hybrid transparent conductive layer. Thus, the layer 309 may optionally be an organic (polymeric or a mixed polymeric-molecular) or a hybrid (organic-inorganic). Examples of such a transparent conductive layer are described e.g., in commonly-assigned US Patent Application Publication Number 20040187917, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than nanoflake-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Figure 6:
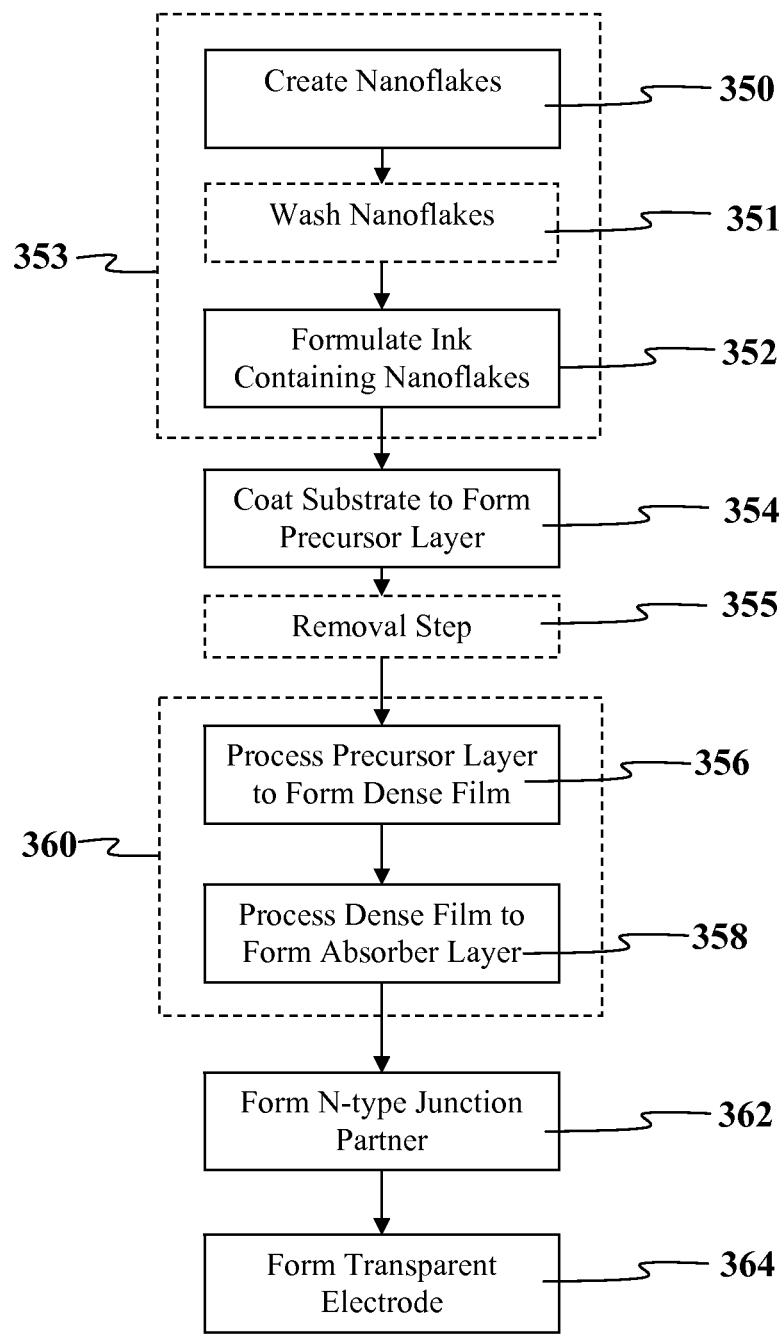
FIG. 6 shows a flowchart of a method according to one embodiment of the present invention.

Referring now to FIG. 6, a flowchart showing one embodiment of a method according to the present invention will now be described. FIG. 6 shows that at step 350, the nanoflakes 108 may be created using one of the processes described herein. Optionally, there may be a washing step 351 to remove any undesired residue. Once the nanoflakes 108 are created, step 352 shows that the ink may be formulated with the nanoflakes and at least one other component such as but not limited to a carrier liquid. Optionally, it should be understood that some embodiments of the invention may combine the steps 350 and 352 into one process step as indicated by box 353 (shown in phantom) if the creation process results in a coatable formulation. As one nonlimiting example, this may be the case if the dispersants and/or solvents used during formation can also be used to form a good coating. At step 354, the substrate 102 may be coated with the ink to form the precursor layer 106. Optionally, there may be a step 355 of removing dispersant and/or other residual of the as-coated layer 106 by methods such as but not limited to heating, washing, or the like. Optionally, step 355 may involve a step of removing solve after ink deposition by using a drying device such as but not limited to a drying tunnel/furnace. Step 356 shows the precursor layer is processed to form a dense film which may then further be processed at step 358 to form the absorber layer. Optionally, it should be understood that some embodiments of the invention may combine the steps 356 and 358 into one process step if the dense film is an absorber layer and no further processing of the film is needed. Step 360 shows that the N-type junction may be formed over and/or in contact with the absorber layer. Step 362 shows that a transparent electrode may be formed over the N-type junction layer to create a stack that can function as a solar cell.

Figure 7:
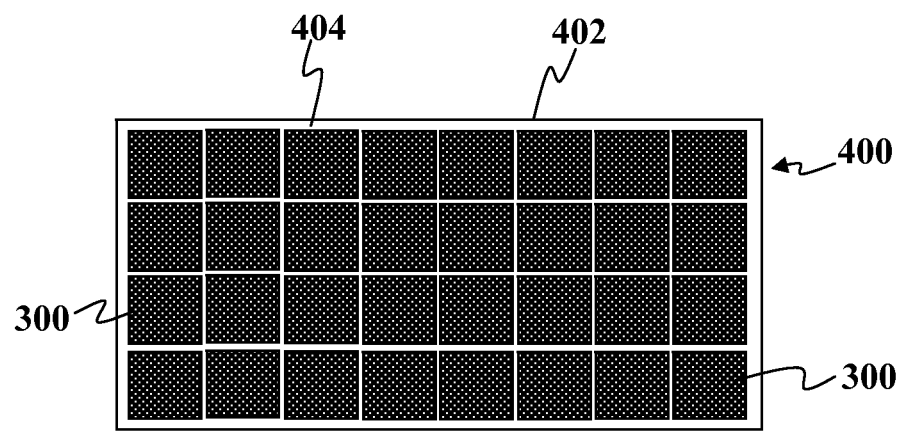
FIG. 7 shows a module having a plurality of photovoltaic devices according to one embodiment of the present invention.

Referring now to FIG. 7, it should also be understood that a plurality of devices 300 may be incorporated into a module 400 to form a solar module that includes various packaging, durability, and environmental protection features to enable the devices 300 to be installed in an outdoor environment. In one embodiment, the module 400 may include a frame 402 that supports a substrate 404 on which the devices 300 may be mounted. This module 400 simplifies the installation process by allowing a plurality of devices 300 to be installed at one time. Alternatively, flexible form factors may also be employed. It should also be understood that an encapsulating device and/or layers may be used to protect from environmental influences. As a nonlimiting example, the encapsulating device and/or layers may block the ingress of moisture and/or oxygen and/or acidic rain into the device, especially over extended environmental exposure.

Extra Source of Chalcogen

It should be understood that the present invention using nanoflakes may also use an extra chalcogen source in a manner similar to that described in copending, U.S. patent application Ser. No. 11/290,633, wherein the precursor material contains 1) chalcogenides such as, but not limited to, copper selenide, and/or indium selenide and/or gallium selenide and/or 2) a source of extra chalcogen such as, but not limited to, Se or S nanoparticles less than about 200 nanometers in size. In one nonlimiting example, the chalcogenide and/or the extra chalcogen may be in the form of nanoflakes and/or nanoflakes while the extra source of chalcogen may be flakes and/or non-flakes. The chalcogenide nanoflakes may be one or more binary alloy chalcogenides such as, but not limited to, group IB-binary chalcogenide nanoparticles (e.g. group IB non-oxide chalcogenides, such as Cu—Se, CuS or CuTe) and/or group IIIA-chalcogenide nanoparticles (e.g., group IIIA non-oxide chalcogenides, such as Ga(Se, S, Te), In(Se, S, Te) and Al(Se, S, Te). In other embodiments, the nanoflakes may be non-chalcogenides such as but not limited to group IB and/or IIIA materials like CuIn, CuGa, and/or InGa. If the chalcogen melts at a relatively low temperature (e.g., 220° C. for Se, 120° C. for S) the chalcogen is already in a liquid state and makes good contact with the nanoflakes. If the nanoflakes and chalcogen are then heated sufficiently (e.g., at about 375° C.), the chalcogen reacts with the chalcogenides to form the desired IB-IIIA-chalcogenide material.

Figure 8A:
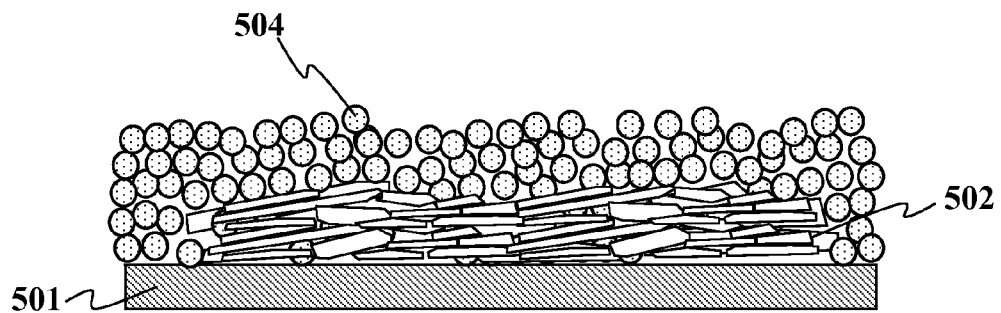
FIGS. 8A-8C show a schematic view of planar particles used with spherical particles according to one embodiment of the present invention.
Figure 8B:
Figure 8B:
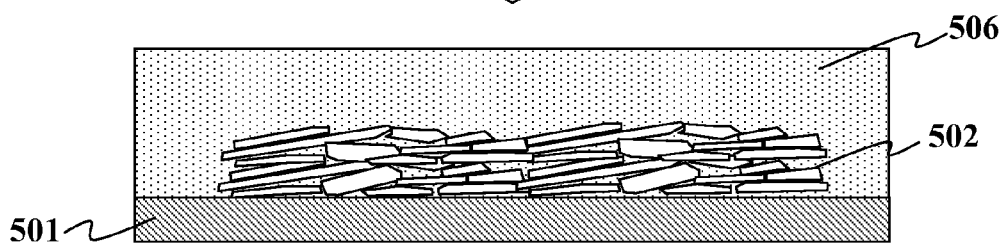
Figure 8C:
Figure 8C:
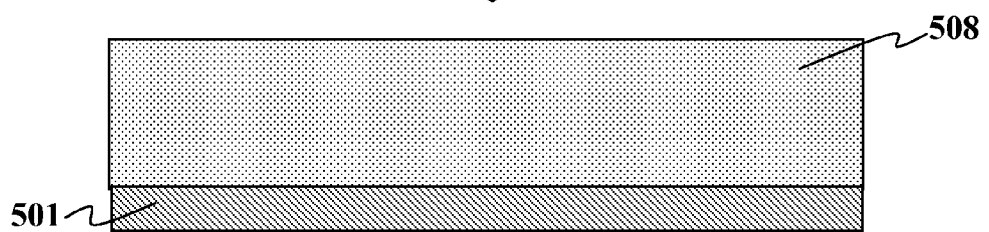

Referring now to FIGS. 8A-8C, the chalcogenide nanoflakes 502 and a source of extra chalcogen, e.g., in the form of a powder containing chalcogen particles 504 may be supported on a substrate 501. As a nonlimiting example, the chalcogen particles may be micron- and/or submicron-sized non-oxygen chalcogen (e.g., Se, S or Te) particles, e.g., a few hundred nanometers or less to a few microns in size. The mixture of chalcogenide nanoflakes 502 and chalcogen particles 504 is placed on the substrate 501 and heated to a temperature sufficient to melt the extra chalcogen particles 504 to form a liquid chalcogen 506 as shown in FIG. 8B. The liquid chalcogen 506 and chalcogenides 502 are heated to a temperature sufficient to react the liquid chalcogen 506 with the chalcogenides 502 to form a dense film of a group IB-IIIA-chalcogenide compound 508 as shown in FIG. 1C. The dense film of group IB-IIIA-chalcogenide compound is then cooled down.

Although not limited to the following, the chalcogenide particles 502 may be obtained starting from a binary chalcogenide feedstock material, e.g., micron size particles or larger. Examples of chalcogenide materials available commercially are listed in Table I below.

TABLE I

| Chemical | Formula | Typical % Purity |
| --- | --- | --- |
| Aluminum selenide | Al2Se3 | 99.5 |
| Aluminum sulfide | Al2S3 | 98 |
| Aluminum sulfide | Al2S3 | 99.9 |
| Aluminum telluride | Al2Te3 | 99.5 |
| Copper selenide | Cu—Se | 99.5 |
| Copper selenide | Cu2Se | 99.5 |
| Gallium selenide | Ga2Se3 | 99.999 |
| Copper sulfide | Cu2S(may be Cu1.8-2S) | 99.5 |
| Copper sulfide | CuS | 99.5 |
| Copper sulfide | CuS | 99.99 |
| Copper telluride | CuTe(generally Cu1.4Te) | 99.5 |
| Copper telluride | Cu2Te | 99.5 |
| Gallium sulfide | Ga2S3 | 99.95 |
| Gallium sulfide | GaS | 99.95 |
| Gallium telluride | GaTe | 99.999 |
| Gallium telluride | Ga2Te3 | 99.999 |
| Indium selenide | In2Se3 | 99.999 |
| Indium selenide | In2Se3 | 99.99% |
| Indium selenide | In2Se3 | 99.9 |
| Indium selenide | In2Se3 | 99.9 |
| Indium sulfide | InS | 99.999 |
| Indium sulfide | In2S3 | 99.99 |
| Indium telluride | In2Te3 | 99.999 |
| Indium telluride | In2Te3 | 99.999 |

Examples of chalcogen powders and other feedstocks commercially available are listed in Table II below.

TABLE II

| Chemical | Formula | Typical % Purity |
| --- | --- | --- |
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |
| Tellurium metal | Te | 99.5 |
| Tellurium metal | Te | 99.9999 |
| Tellurium metal | Te | 99.99 |
| Tellurium metal | Te | 99.999 |
| Tellurium metal | Te | 99.999 |
| Tellurium metal | Te | 99.95 |
| Tellurium metal | Te | 99.5 |

Printing a Layer of the Extra Source of Chalcogen

Figure 9A:
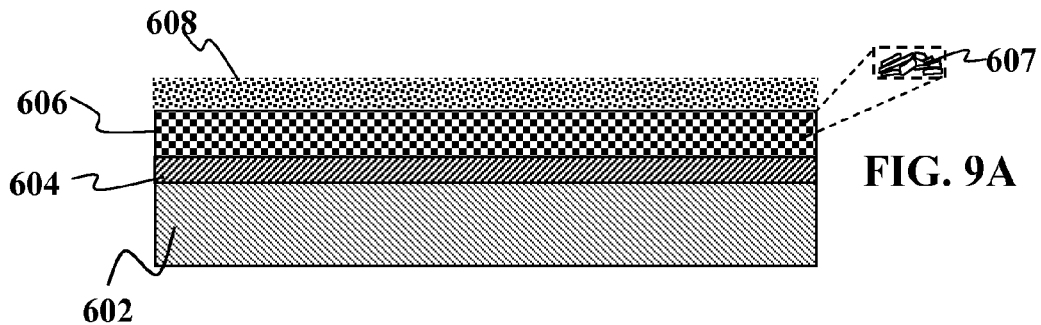
FIGS. 9A-9D show a schematic view of a discrete printed layer of a chalcogen source used with planar particles according to one embodiment of the present invention.
Figure 9B:
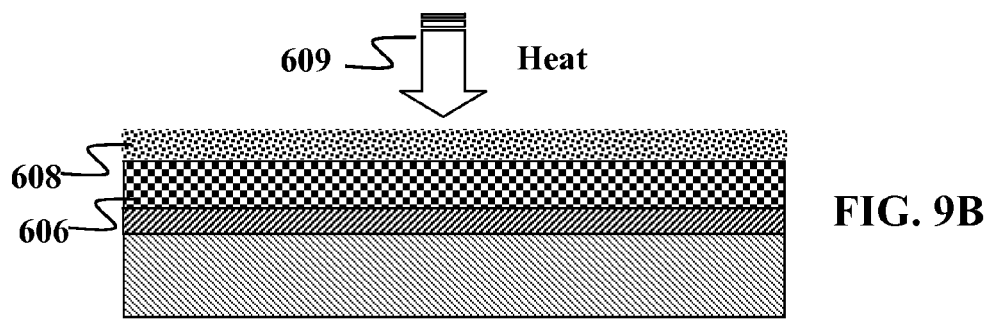
Figure 9C:
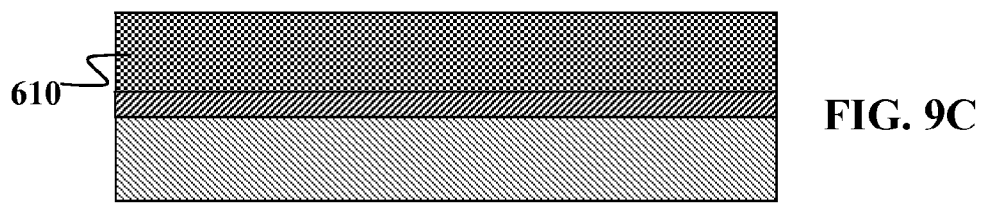

Referring now to FIGS. 9A-9E, another embodiment of the present invention using nanoflakes will now be described. FIG. 9A shows a substrate 602 with a contact layer 604 on which a nanoflake precursor layer 606 is formed. An extra source of chalcogen may be provided as a discrete layer 608 containing an extra source of chalcogen such as, but not limited to, elemental chalcogen particles 607 over a nanoflake precursor layer 606. By way of example, and without loss of generality, the chalcogen particles may be particles of selenium, sulfur or tellurium. As shown in FIG. 9B, heat 609 is applied to the nanoflake precursor layer 606 and the layer 608 containing the chalcogen particles to heat them to a temperature sufficient to melt the chalcogen particles 607 and to react the chalcogen particles 607 with the elements in the precursor layer 606. It should be understood that the nanoflakes may be made of a variety of materials include but not limited to group IB elements, group IIIA elements, and/or group VIA elements. The reaction of the chalcogen particles 607 with the elements of the precursor layer 606 forms a compound film 610 of a group IB-IIIA-chalcogenide compound as shown in FIG. 9C. Preferably, the group IB-IIIA-chalcogenide compound is of the form $CuIn_{1-x}Ga_xSe_{2(1-y)}S_{2y}$, where $0 \leq x \leq 1$ and $0 \leq y \leq 1$. It should be understood that in some embodiments, the precursor layer 106 may be sintered prior to application of the layer 108 with the extra source of chalcogen. In other embodiments, the precursor layer 106 is not pre-heated and the layers 106 and 108 are heated together.

In one embodiment of the present invention, the precursor layer 606 may be between about 4.0 to about 0.5 microns thick. The layer 608 containing chalcogen particles 607 may have a thickness in the range of about 4.0 microns to about 0.5 microns. The chalcogen particles 607 in the layer 608 may be between about 1 nanometer and about 25 microns in size, preferably between about 25 nanometers and about 300 nanometers in size. It is noted that the chalcogen particles 607 may be initially larger than the final thickness of the IB-IIIA-VIA compound film 610. The chalcogen particles 607 may be mixed with solvents, carriers, dispersants etc. to prepare an ink or a paste that is suitable for wet deposition over the precursor layer 606 to form the layer 608. Alternatively, the chalcogen particles 607 may be prepared for deposition on a substrate through dry processes to form the layer 608. It is also noted that the heating of the layer 608 containing chalcogen particles 607 may be carried out by an RTA process, e.g., as described above.

The chalcogen particles 607 (e.g., Se or S) may be formed in several different ways. For example, Se or S particles may be formed starting with a commercially available fine mesh powder (e.g., 200 mesh/75 micron) and ball milling the powder to a desirable size. A typical ball milling procedure may use a ceramic milling jar filled with grinding ceramic balls and a feedstock material, which may be in the form of a powder, in a liquid medium. When the jar is rotated or shaken, the balls shake and grind the powder in the liquid medium to reduce the size of the particles of the feedstock material. Optionally, the process may include dry (pre-) grinding of bigger pieces of material such as but not limited to Se. The dry-grinding may use pieces 2-6 mm and smaller, but it would be able to handle bigger pieces as well. Note that this is true for all size reductions where the process may start with bigger feedstock materials, dry grinding, and subsequently starting wet grinding (such as but not limited to ball milling). The mill itself may range from a small media mill to a horizontal rotating ceramic jar.

Figure 9D:
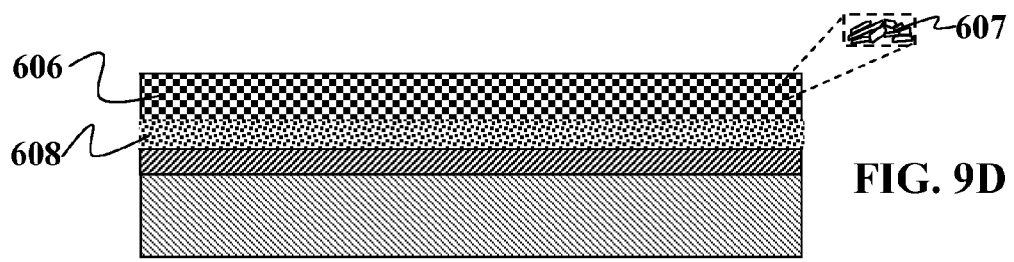

Referring now to FIG. 9D, it should also be understood that in some embodiments, the layer 608 of chalcogen particles may be formed below the precursor layer 606. This position of the layer 608 still allows the chalcogen particles to provide a sufficient surplus of chalcogen to the precursor layer 606 to fully react with the group IB and group IIIA elements in layer 606. Additionally, since the chalcogen released from the layer 608 may be rising through the layer 606, this position of the layer 608 below layer 606 may be beneficial to generate greater intermixing between elements. The thickness of the layer 608 may be in the range of about 4.0 microns to about 0.5 microns. In still other embodiments, the thickness of layer 608 may be in the range of about 500 nm to about 50 nm. In one nonlimiting example, a separate Se layer of about 100 nm or more might be sufficient. The coating of chalcogen may incorporate coating with powder, Se evaporation, or other Se deposition method such as but not limited to chemical vapor deposition (CVD), physical vapor deposition (PVD), atomic layer deposition (ALD), electroplating, and/or similar or related methods using singly or in combination. Other types of material deposition technology may be used to get Se layers thinner than 0.5 microns or thinner than 1.0 micron. It should also be understood that in some embodiments, the extra source of chalcogen is not limited to only elemental chalcogen, but in some embodiments, may be an alloy and/or solution of one or more chalcogens.

Optionally, it should be understood that the extra source of chalcogen may be mixed with and/or deposited within the precursor layer, instead of as a discrete layer. In one embodiment of the present invention, oxygen-free particles or substantially oxygen free particles of chalcogen could be used. If the chalcogen is used with microflakes and/or plate shaped precursor materials, densification might not end up an issue due to the higher density achieved by using planar particles, so there is no reason to exclude printing Se and/or other source of chalcogen within the precursor layer as opposed to a discrete layer. This may involve not having to heat the precursor layer to the previous processing temperatures. In some embodiments, this may involve forming the film without heating above about 400° C. In some embodiments, this may involve not having to heat above about 300° C.

In still other embodiments of the present invention, multiple layers of material may be printed and reacted with chalcogen before deposition of the next layer. One nonlimiting example would be to deposit a Cu—In—Ga layer, anneal it, then deposit an Se layer then treat that with RTA, follow that up by depositing another precursor layer rich in Ga, followed by another deposition of Se, and finished by a second RTA treatment. More generically, this may include forming a precursor layer (either heat or not) then coating a layer of the extra source of chalcogen (then heat or not) then form another layer of more precursor (heat or not) and then for another layer of the extra source of chalcogen (then heat or not) and repeat as many times as desired to grade the composition or nucleating desired crystal sizes. In one nonlimiting example, this may be used to grade the gallium concentration. In another embodiment, this may be used to grade the copper concentration. In yet another embodiment, this may be used to grade the indium concentration. In a still further embodiment, this may be used to grade the selenium concentration. In yet another embodiment this may be used to grade the selenium concentration. Another reason would be to first grow copper rich films to get big crystals and then to start adding copper-poor layers to get the stoichiometry back. Of course this embodiment can combined to allow the chalcogen to be deposited in the precursor layer for any of the steps involved.

Figure 9E:
FIG. 9E shows particles having a shell of chalcogen according to one embodiment of the present invention.

Referring now to FIG. 9E, an alternative way to take advantage of the low melting points of chalcogens such as but not limited to Se and S is to form core-shell nanoflakes in which the core is a nanoflake 607 and the shell 620 is a chalcogen coating. The chalcogen 620 melts and quickly reacts with the material of the core nanoflakes 607. As a nonlimiting example, the core may be a mix of elemental particles of groups IB (e.g., Cu) and/or IIIA (e.g., Ga and In), which may be obtained by ball milling of elemental feedstock to a desired size. Examples of elemental feedstock materials available are listed in Table III below. The core may also be a chalcogenide core or other material as described herein.

TABLE III

| Chemical | Formula | Typical % Purity |
| --- | --- | --- |
| Copper metal | Cu | 99.99 |
| Copper metal | Cu | 99 |
| Copper metal | Cu | 99.5 |
| Copper metal | Cu | 99.5 |
| Copper metal | Cu | 99 |
| Copper metal | Cu | 99.999 |
| Copper metal | Cu | 99.999 |
| Copper metal | Cu | 99.9 |
| Copper metal | Cu | 99.5 |
| Copper metal | Cu | 99.9 ($O_2$ typ. 2-10%) |
| Copper metal | Cu | 99.99 |
| Copper metal | Cu | 99.997 |
| Copper metal | Cu | 99.99 |
| Gallium metal | Ga | 99.999999 |
| Gallium metal | Ga | 99.99999 |
| Gallium metal | Ga | 99.99 |
| Gallium metal | Ga | 99.9999 |
| Gallium metal | Ga | 99.999 |
| Indium metal | In | 99.9999 |
| Indium metal | In | 99.999 |
| Indium metal | In | 99.999 |
| Indium metal | In | 99.99 |
| Indium metal | In | 99.999 |
| Indium metal | In | 99.99 |
| Indium metal | In | 99.99 |

Chalcogen-Rich Chalcogenide Particles

Figure 10A:
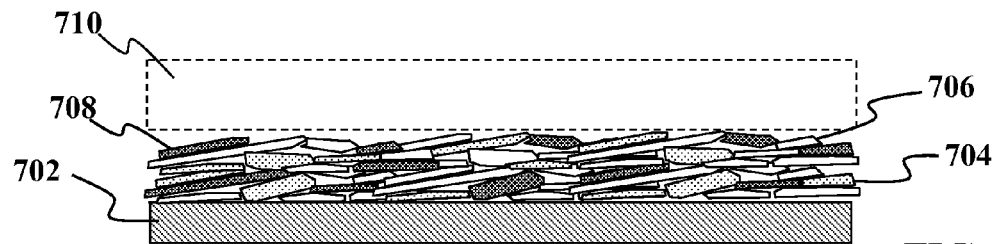
FIGS. 10A-10C show the use of chalcogenide planar particles according to one embodiment of the present invention.
Figure 10B:
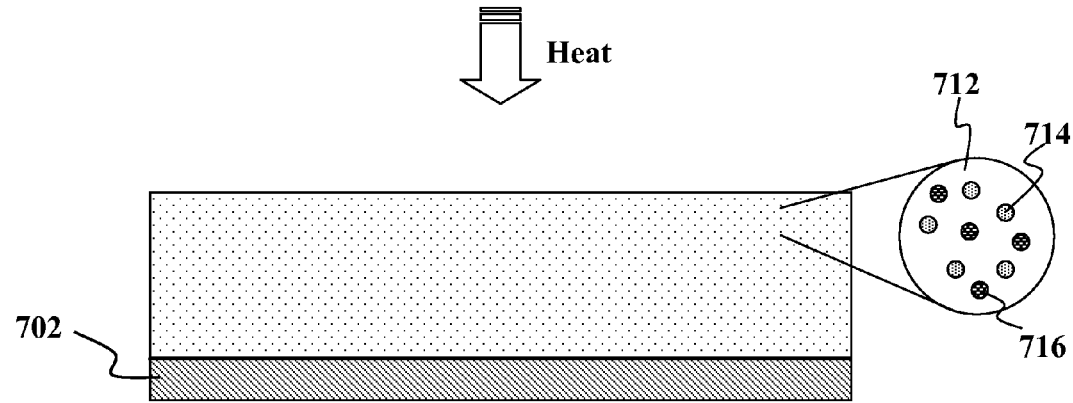
Figure 10C:
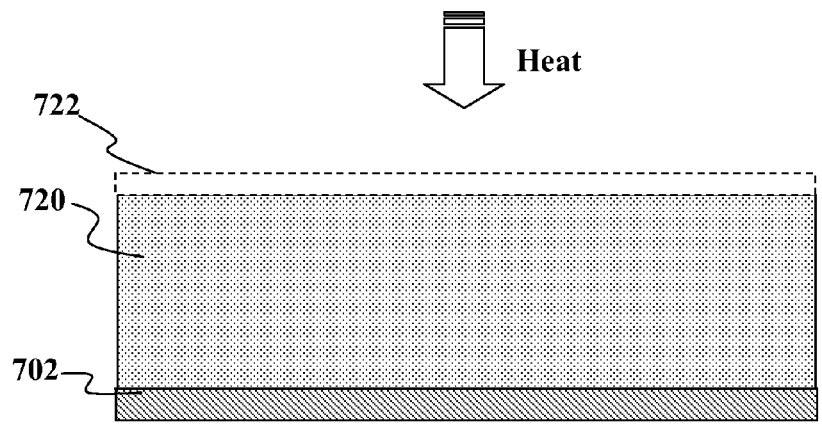

Referring now to FIGS. 10A-10C, it should be understood that yet another embodiment of the present invention includes embodiments where the nanoflake particles may be chalcogenide particles that are chalcogen-rich (whether they be group IB-chalcogenides, group IIIA chalcogenides, or other chalcogenides). In these embodiments, the use of a separate source of chalcogen may not be needed since the excess chalcogen is contained within the chalcogenide particles themselves. In one nonlimiting example of a group IB-chalcogenide, the chalcogenide may be copper selenide, wherein the material comprises $Cu_xSe_y$, wherein x<y. Thus, this is a chalcogen-rich chalcogenide that will provide excess amounts of selenium when the particles of the precursor material are processed.

The purpose of providing an extra source of chalcogen is to first create liquid to enlarge the contact area between the initial solid particles (flakes) and the liquid. Secondly, when working with chalcogen-poor films, the extra source adds chalcogen to get to the stoichiometric desired chalcogen amount. Third, chalcogens such as Se are volatile and inevitably some is lost during processing. So, main purpose is to create liquid. There are also a variety of other routes to increase the amount of liquid when the precursor layer is processed. These routes include but are not limited to: 1) Cu—Se more Se-rich than $Cu_2$-xSe (>377° C., even more liquid above >523° C.); 2) Cu—Se equal to or more Se-rich than $Cu_2Se$ when adding additional Se (>220° C.); 3) In—Se of composition $In_4Se_3$, or in between $In_4Se_3$ and $In_1Se_1$ (>550° C.); 4) In—Se equal to or more Se-rich than $In_4Se_3$ when adding additional Se (>220° C.); 5) In—Se in between In and $In_4Se_3$ (>156° C., preferably in an oxygen-free environment since In is created 6) Ga-emulsion (>29° C., preferably oxygen-free); and hardly (but possible) for Ga—Se. Even when working with Se vapor, it still would be tremendously advantageous to create additional liquid in the precursor layer itself using one of the above methods or by a comparable method.

Referring now to FIG. 10A, it should be understood that the ink may contain multiple types of particles. In FIG. 10A, the particles 704 are a first type of particle and the particles 706 are a second type of particle. In one nonlimiting example, the ink may have multiple types of particles wherein only one type of particle is a chalcogenide and is also chalcogen-rich. In other embodiments, the ink may have particles wherein at least two types of chalcogenides in the ink are chalcogen-rich. As a nonlimiting example, the ink may have $Cu_xSe_y$ (wherein x<y) and $In_aSe_b$ (wherein a<b). In still further embodiments, the ink may have particles 704, 706, and 708 (shown in phantom) wherein at least three types of chalcogenide particles are in the ink. By way of nonlimiting example, the chalcogen-rich chalcogenide particles may be Cu—Se, In—Se, and/or Ga—Se. All three may be chalcogen-rich. A variety of combinations are possible to obtain the desired excess amount of chalcogen. If the ink has three types of particles, it should be understood that not all of the particles need to be chalcogenides or chalcogen rich. Even within an ink with only one type of particle, e.g. Cu—Se, there may be a mixture of chalcogen-rich particles e.g. $Cu_xSe_y$ with x<y, and non-chalcogen-rich particles, e.g. $Cu_xSe_y$ with x>y. As a nonlimiting example, a mixture may contain particles of copper selenide that may have the following compositions: $Cu_1Se_1$ and $Cu_1Se_2$.

Referring still to FIG. 10A, it should also be understood that even with the chalcogen-rich particles, an additional layer 710 (shown in phantom) may be also printed or coated on to the ink to provide an excess source of chalcogen as described previously. The material in this layer may be a pure chalcogen, a chalcogenide, or a compound that contains chalcogen. As seen in FIG. 10C, the additional layer 710 (shown in phantom) may also be printed onto the resulting film if further processing with chalcogen is desired.

Referring now to FIG. 10B, heat may be applied to the particles 704 and 706 to begin converting them. Due to the various melting temperatures of the materials in the particles, some may start to assume a liquid form sooner than others. In the present invention, this is particularly advantageous if the materials assuming liquid form also release the excess chalcogen as a liquid 712 which may surround the other materials and/or elements such as 714 and 716 in the layer. FIG. 10B includes a view with an enlarged view of the liquid 712 and materials and/or elements 714 and 716.

The amount of extra chalcogen provided by all of the particles overall is at a level that is equal to or above the stoichiometric level found in the compound after processing. In one embodiment of the present invention, the excess amount of chalcogen comprises an amount greater than the sum of 1) a stoichiometric amount found in the final IB-IIIA-chalcogenide film and 2) a minimum amount of chalcogen necessary to account for losses during processing to form the final IB-IIIA-chalcogenide having the desired stoichiometric ratio. Although not limited to the following, the excess chalcogen may act as a flux that will liquefy at the processing temperature and promote greater atomic intermixing of particles provided by the liquefied excess chalcogen. The liquefied excess chalcogen may also ensure that sufficient chalcogen is present to react with the group IB and IIIA elements. The excess chalcogen helps to "digest" or "solubilize" the particles or flakes. The excess chalcogen will escape from the layer before the desired film is fully formed.

Referring now to FIG. 10C, heat may continue to be applied until the group IB-IIIA chalcogenide film 720 is formed. Another layer 722 (shown in phantom) may be applied for further processing of the film 720 if particular features are desired. As a nonlimiting example, an extra source of gallium may be added to the top layer and further reacted with the film 720. Others sources may provide additional selenium to improve selenization at the top surface of the film 720.

It should be understood that a variety of chalcogenide particles may also be combined with non-chalcogenide particles to arrive at the desired excess supply of chalcogen in the precursor layer. The following table (Table IV) provides a non-limiting matrix of some of the possible combinations between chalcogenide particles listed in the rows and the non-chalcogenide particles listed in the columns.

TABLE IV

|        | Cu           | In            | Ga            | Cu—In         | Cu—Ga         | In—Ga         | Cu—In—Ga      |
|--------|--------------|---------------|---------------|---------------|---------------|---------------|---------------|
| Se     | Se + Cu      | Se + In       | Se + Ga       | Se + Cu—In    | Se + Cu—Ga    | Se + In—Ga    | Se + Cu—In—Ga |
| Cu—Se  | Cu—Se + Cu   | Cu—Se + In    | Cu—Se + Ga    | Cu—Se + Cu—In | Cu—Se + Cu—Ga | Cu—Se + In—Ga | Cu—Se + Cu—In—Ga |
| In—Se  | In—Se + Cu   | In—Se + In    | In—Se + Ga    | In—Se + Cu—In | In—Se + Cu—Ga | In—Se + In—Ga | In—Se + Cu—In—Ga |
| Ga—Se  | Ga—Se + Cu   | Ga—Se + In    | Ga—Se + Ga    | Ga—Se + Cu—In | Ga—Se + Cu—Ga | Ga—Se + In—Ga | Ga—Se + Cu—In—Ga |
| Cu—In—Se | Cu—In—Se + Cu | Cu—In—Se + In | Cu—In—Se + Ga | Cu—In—Se + Cu—In | Cu—In—Se + Cu—Ga | Cu—In—Se + In—Ga | Cu—In—Se + Cu—In—Ga |

TABLE IV-continued

|  | Cu | In | Ga | Cu—In | Cu—Ga | In—Ga | Cu—In—Ga |
|---|---|---|---|---|---|---|---|
| Cu—Ga—Se | Cu—Ga—Se + Cu | Cu—Ga—Se + In | Cu—Ga—Se + Ga | Cu—Ga—Se + Cu—In | Cu—Ga—Se + Cu—Ga | Cu—Ga—Se + In—Ga | Cu—Ga—Se + Cu—In—Ga |
| In—Ga—Se | In—Ga—Se + Cu | In—Ga—Se + In | In—Ga—Se + Ga | In—Ga—Se + CuIn | In—Ga—Se + Cu—Ga | In—Ga—Se + In—Ga | In—Ga—Se + Cu—In—Ga |
| Cu—In—Ga—Se | Cu—In—Ga—Se + Cu | Cu—In—Ga—Se + In | Cu—In—Ga—Se + Ga | Cu—In—Ga—Se + CuIn | Cu—In—Ga—Se + CuGa | Cu—In—Ga—Se + InGa | Cu—In—Ga—Se + Cu—In—Ga |

In yet another embodiment, the present invention may combine a variety of chalcogenide particles with other chalcogenide particles. The following table (Table V) provides a non-limiting matrix of some of the possible combinations between chalcogenide particles listed for the rows and chalcogenide particles listed for the columns.

TABLE V

|  | Cu—Se | In—Se | Ga—Se | Cu—In—Se | Cu—Ga—Se | In—Ga—Se | Cu—In—Ga—Se |
|---|---|---|---|---|---|---|---|
| Se | Se + Cu—Se | Se + In—Se | Se + Ga—Se | Se + Cu—In—Se | Se + Cu—Ga—Se | Se + In—Ga—Se | Se + Cu—In—Ga—Se |
| Cu—Se | Cu—Se | Cu—Se + In—Se | Cu—Se + Ga—Se | Cu—Se + Cu—In—Se | Cu—Se + Cu—Ga—Se | Cu—Se + In—Ga—Se | Cu—Se + Cu—In—Ga—Se |
| In—Se | In—Se + Cu—Se | In—Se | In—Se + Ga—Se | In—Se + Cu—In—Se | In—Se + Cu—Ga—Se | In—Se + In—Ga—Se | In—Se + Cu—In—Ga—Se |
| Ga—Se | Ga—Se + Cu—Se | Ga—Se + In—Se | Ga—Se | Ga—Se + Cu—In—Se | Ga—Se + Cu—Ga—Se | Ga—Se + In—Ga—Se | Ga—Se + Cu—In—Ga—Se |
| Cu—In—Se | Cu—In—Se + Cu—Se | Cu—In—Se + In—Se | Cu—In—Se + Ga—Se | Cu—In—Se | Cu—In—Se + Cu—Ga—Se | Cu—In—Se + In—Ga—Se | Cu—In—Se + Cu—In—Ga—Se |
| Cu—Ga—Se | Cu—Ga—Se + Cu—Se | Cu—Ga—Se + In—Se | Cu—Ga—Se + Ga—Se | Cu—Ga—Se + Cu—In—Se | Cu—Ga—Se | Cu—Ga—Se + In—Ga—Se | Cu—Ga—Se + Cu—In—Ga—Se |
| In—Ga—Se | In—Ga—Se + Cu—Se | In—Ga—Se + In—Se | In—Ga—Se + Ga—Se | In—Ga—Se + Cu—In—Se | In—Ga—Se + Cu—Ga—Se | In—Ga—Se | In—Ga—Se + Cu—In—Ga—Se |
| Cu—In—Ga—Se | Cu—In—Ga—Se + Cu—Se | Cu—In—Ga—Se + In—Se | Cu—In—Ga—Se + Ga—Se | Cu—In—Ga—Se + Cu—In—Se | Cu—In—Ga—Se + Cu—Ga—Se | Cu—In—Ga—Se + In—Ga—Se | Cu—In—Ga—Se |

Nucleation Layer

Figure 11A:
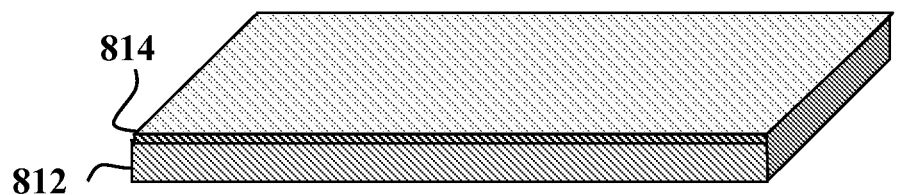
FIGS. 11A-11C show a nucleation layer according to one embodiment of the present invention.
Figure 11B:
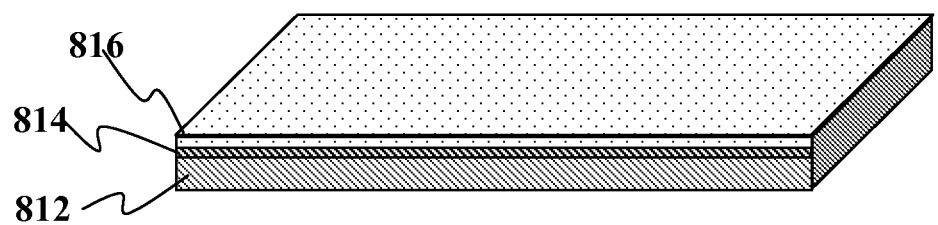
Figure 11C:
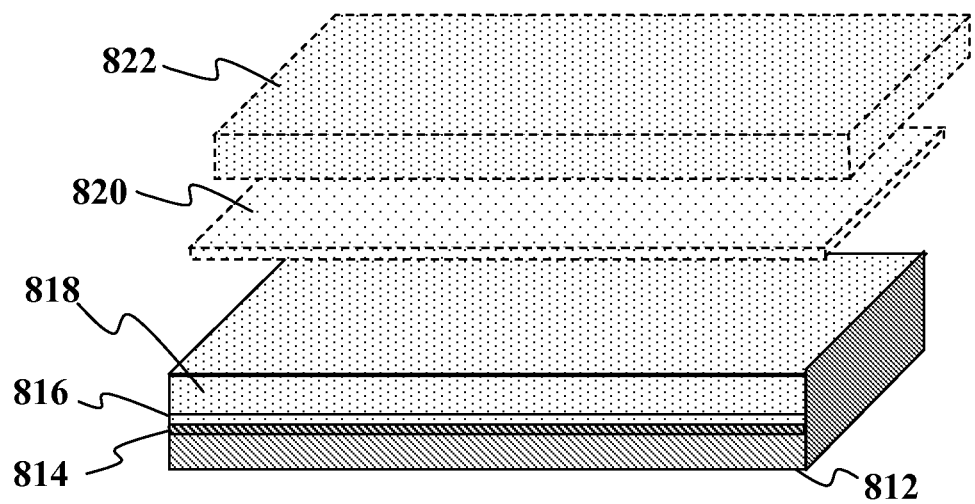

Referring now to FIGS. 11A-11C, yet another embodiment of the present invention using flakes such as but not limited to nanoflakes will now be described. This embodiment provides a method for improving crystal growth on the substrate by depositing a thin group IB-IIIA chalcogenide layer on the substrate to serve as a nucleation plane for film growth for the precursor layer which is formed on top of the thin group IB-IIIA chalcogenide layer. This nucleation layer of a group IB-IIIA chalcogenide may be deposited, coated, or formed prior to forming the precursor layer. The nucleation layer may be formed using vacuum or non-vacuum techniques. The precursor layer formed on top of the nucleation layer may be formed by a variety of techniques including but not limited to using an ink containing a plurality of nanoflakes as described in this application.

FIG. 11A shows that the absorber layer may be formed on a substrate 812, as shown in FIG. 11A. A surface of the substrate 812, may be coated with a contact layer 814 to promote electrical contact between the substrate 812 and the absorber layer that is to be formed on it. By way of example, an aluminum substrate 812 may be coated with a contact layer 814 of molybdenum. As discussed herein, forming or disposing a material or layer of material on the substrate 812 includes disposing or forming such material or layer on the contact layer 814, if one is used.

As shown in FIG. 11B, a nucleation layer 816 is formed on the substrate 812. This nucleation layer may comprise of a group IB-IIIA chalcogenide and may be deposited, coated, or formed prior to forming the precursor layer. As a nonlimiting example, this may be a CIGS layer, a Ga—Se layer, any other high-melting IB-IIIA-chalcogenide layer, or even a thin layer of gallium.

Referring now to FIG. 11C, once the nucleation layer is formed, the precursor layer 818 may be formed on top of the nucleation layer. In some embodiments, the nucleation layer and the precursor layer may be formed simultaneously. The precursor layer 818 may contain one or more group IB elements and one or more group IIIA elements. Preferably, the one or more group IB elements include copper. The one or more group IIIA elements may include indium and/or gallium. The precursor layer may be formed from a film, e.g., using any of the techniques described above.

Referring still to FIG. 11C, it should also be understood that the structure of the alternating nucleation layer and precursor layer may be repeated in the stack. FIG. 11C show that, optionally, another nucleation layer 820 (shown in phantom)

may be formed over the precursor layer 818 to continue the structure of alternating nucleation layer and precursor layer. Another precursor layer 822 may then be formed over the nucleation layer 820 to continue the layering, which may be repeated as desired. Although not limited to the following, there may be 2, 3, 4, 5, 6, 7, 8, 9, 10, or more sets of alternating nucleation layers and precursor layers to build up the desired qualities. The each set may have different materials or amounts of materials as compared to other sets in the stack. The alternating layers may be solution deposited, vacuum deposited or the like. Different layers may be deposited by different techniques. In one embodiment, this may involve solution depositing (or vacuum depositing) a precursor layer (optionally with a desired Cu-to-In-to-Ga ratio), subsequently adding chalcogen (solution-based, vacuum-based, or otherwise such as but not limited to vapor or H2Se, etc. . . . ), optionally heat treating this stack (during or after introduction of the chalcogen source), subsequently depositing an additional precursor layer (optionally with a desired Cu-to-In-to-Ga ratio), and finally heat treating the final stack (during or after the introduction of additional chalcogen). The goal is to create planar nucleation so that there are no holes or areas where the substrate will not be covered by subsequent film formation and/or crystal growth. Optionally, the chalcogen source may also be introduced before adding the first precursor layer containing Cu+In+Ga. It should also be understood that in some other embodiments, layer 820 may be a chalcogen containing layer, such as but not limited to a selenium layer, and be heated with each precursor layer (or at the end after all precursor layers are formed).

Nucleation Layer by Thermal Gradient

Figure 12A:
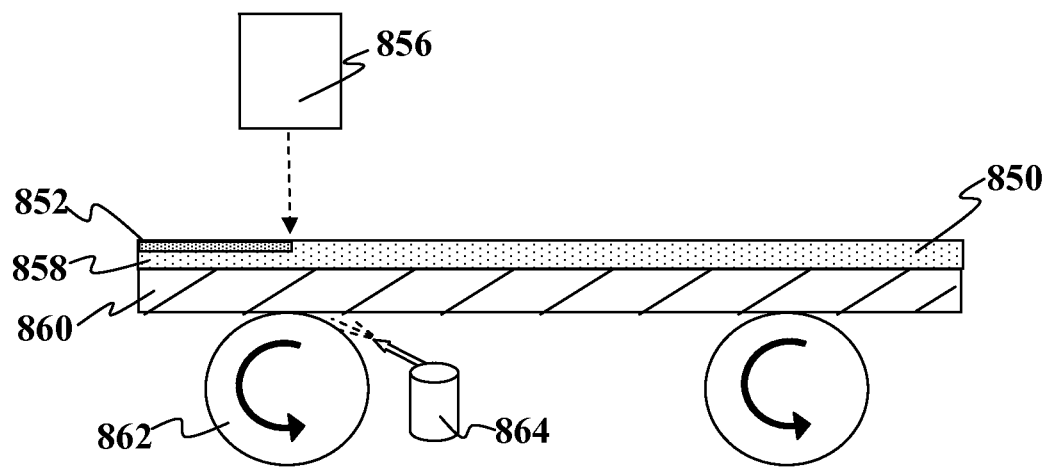
FIGS. 12A-12B show schematics of devices which may be used to create a nucleation layer through a thermal gradient.
Figure 12B:
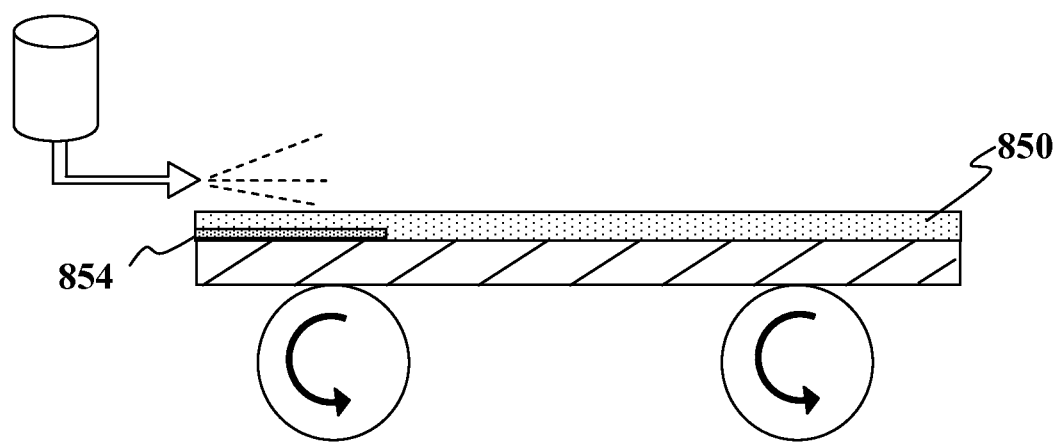

Referring now to FIGS. 12A-12B, it should be understood that a nucleation layer for use with a nanoflake based precursor material may also be formed by creating a thermal gradient in the precursor layer 850. As a nonlimiting example, the nucleation layer 852 may be formed starting from the upper portion of the precursor layer or optionally by forming the nucleation layer 854 from a lower portion of the precursor layer. In one embodiment of the present invention, the nucleation layer may be viewed as being a layer where an initial IB-IIIA-VIA compound crystal growth is preferred over crystal growth in another location of the precursor layer and/or stacks of precursor layers. The nucleation layer 852 or 854 is formed by creating a thermal gradient in the precursor layer such that one portion of the layer reaches a temperature sufficient to begin crystal growth. The nucleation layer may be in the form a nucleation plane having a substantially planar configuration to promote a more even crystal growth across the substrate while minimizing the formation of pinholes and other anomalies.

As seen in FIG. 12A, in one embodiment of the present invention, the thermal gradient used to form the nucleation layer 852 may be created by using a laser 856 to increase only an upper portion of the precursor layer 850 to a processing temperature. The laser 856 may be pulsed or otherwise controlled to not heat the entire thickness of the precursor layer to a processing temperature. The backside 858 of the precursor layer and the substrate 860 supporting it may be in contact with cooled rollers 862, cooled planar contact surface, or cooled drums which provide an external source of cooling to prevent lower portions of the layer from reaching processing temperature. Cooled gas 864 may also be provided on one side of the substrate and adjacent portion of the precursor layer to lower the temperature of the precursor layer below a processing temperature where nucleation to the final IB-IIIA-chalcogenide compound begins. It should be understood that other devices may be used to heat the upper portion of the precursor layer such as but not limited pulsed thermal processing, plasma heating, or heating via IR lamps.

As seen in FIG. 12B, in another embodiment of the present invention, the nucleation layer 854 may be formed on a lower portion of the precursor layer 850 using techniques similar to those described above. Since the substrate 860 used with the present invention may be selected to be thermally conductive, underside heating of the substrate will also cause heating of a lower portion of the precursor layer. The nucleation plane will then form along the bottom portion of the lower portion. The upper portion of the precursor layer may be cooled by a variety of techniques such as, but not limited to, cooled gas, cooled rollers, or other cooling device.

After the nucleation layer has formed, preferably consisting of material identical or close to the final IB-IIIA-chalcogenide compound, the entire precursor layer, or optionally only those portions of the precursor layer that remain more or less unprocessed, will be heated to the processing temperature so that the remaining material will begin to convert into the final IB-IIIA-chalcogenide compound in contact with the nucleation layer. The nucleation layer guides the crystal formation and minimizes the possibility of areas of the substrate forming pinhole or having other abnormalities due to uneven crystal formation.

It should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. In one embodiment of the present invention, this may involve lowering the temperature from between about 50° C. to about 200° C. from a temperature in an initial time period.

Nucleation Layer by Chemical Gradient

Referring now to FIGS. 13A-13F, a still further method of forming a nucleation layer with a nanoflake precursor material according to the present invention will be described in more detail. In this embodiment of the present invention, the composition of the layers of precursor material may be selected so that crystal formation begins sooner in some layers than in other layers. It should be understood that the various methods of forming a nucleation layer may be combined together to facilitate layer formation. As a nonlimiting example, the thermal gradient and chemical gradient methods may be combined to facilitate nucleation layer formation. It is imagined that single or multiple combinations of using a thermal gradient, chemical gradient, and/or thin film nucleation layer may be combined.

Referring now to FIG. 13A, the absorber layer may be formed on a substrate 912, as shown in FIG. 13A. A surface of the substrate 912, may be coated with a contact layer 914 to promote electrical contact between the substrate 912 and the absorber layer that is to be formed on it. By way of example, an aluminum substrate 912 may be coated with a contact layer 914 of molybdenum. As discussed herein, forming or disposing a material or layer of material on the substrate 912 includes disposing or forming such material or layer on the contact layer 914, if one is used. Optionally, it should also be understood that a layer 915 may also be formed on top of contact layer 914 and/or directly on substrate 912. This layer may be solution coated, evaporated, and/or deposited using vacuum based techniques. Although not limited to the following, the layer 915 may have a thickness less than that of the precursor layer 916. In one nonlimiting example, the layer may be between about 1 to about 100 nm in thickness. The layer 915 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

As shown in FIG. 13B, a precursor layer 916 is formed on the substrate. The precursor layer 916 contains one or more group IB elements and one or more group IIIA elements. Preferably, the one or more group IB elements include copper. The one or more group IIIA elements may include indium and/or gallium. The precursor layer may be formed using any of the techniques described above. In one embodiment, the precursor layer contains no oxygen other than those unavoidably present as impurities or incidentally present in components of the film other than the nanoflakes themselves. Although the precursor layer 916 is preferably formed using non-vacuum methods, it should be understood that it may optionally be formed by other means, such as evaporation, sputtering, ALD, etc. By way of example, the precursor layer 916 may be an oxygen-free compound containing copper, indium and gallium. In one embodiment, the non-vacuum system operates at pressures above about 3.2 kPa (24 Torr). Optionally, it should also be understood that a layer 917 may also be formed on top of precursor layer 916. It should be understood that the stack may have both layers 915 and 917, only one of the layers, or none of the layers. Although not limited to the following, the layer 917 may have a thickness less than that of the precursor layer 916. In one nonlimiting example, the layer may be between about 1 to about 100 nm in thickness. The layer 917 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Referring now to FIG. 13C, a second precursor layer 918 of a second precursor material may optionally be applied on top of the precursor layer. The second precursor material may have an overall composition that is more chalcogen-rich than the first precursor material in precursor layer 916. As a nonlimiting example, this allows for creating a gradient of available Se by doing two coatings (preferably with only one heating process of the stack after depositing both precursor layer coatings) where the first coating contains selenides with relatively less selenium in it (but still enough) than the second. For instance, the precursor for the first coating can contain $Cu_xSe_y$ where the x is larger than in the second coating. Or it may contain a mix of $Cu_xSe_y$ particles wherein there is a larger concentration (by weight) of the selenide particles with the large x. In this current embodiment, each layer has preferably the targeted stoichiometry because the C/I/G ratios are kept the same for each precursor layer. Again, although this second precursor layer 918 is preferably formed using non-vacuum methods, it should be understood that it may optionally be formed by other means, such as evaporation, sputtering, ALD, etc. . . .

The rationale behind the use of chalcogen grading, or more general a grading in melting temperature from bottom to top, is to control the relative rate of crystallization in depth and to have the crystallization happen e.g. faster at the bottom portion of the stack of precursor layers than at the top of the stack of precursor layers. The additional rationale is that the common grain structure in typical efficient solution-deposited CIGS cells where the cells have large grains at the top of the photoactive film, which is the part of the photoactive film that is mainly photoactive, and small grains at the back, still have appreciable power conversion efficiencies. It should be understood that in other embodiments, a plurality of many layers of different precursor materials may be used to build up a desired gradient of chalcogen, or more general, a desired gradient in melting temperature and/or subsequent solidification into the final IB-IIIA-chalcogenide compound, or even more general, a desired gradient in melting and/or subsequent solidification into the final IB-IIIA-chalcogenide compound, either due to creating a chemical (compositional) gradient, and/or a thermal gradient, in the resulting film. As nonlimiting examples, the present invention may use particles and/or microflakes and/or nanoflakes with different melting points such as but not limited to lower melting materials Se, $In_4Se_3$, Ga, and $Cu_1Se_1$, compared to higher melting materials $In_2Se_3$, $Cu_2Se$.

Referring now to FIG. 13C, heat 920 is applied to sinter the first precursor layer 916 and the second precursor layer 918 into a group IB-IIIA compound film 922. The heat 920 may be supplied in a rapid thermal annealing process, e.g., as described above. Specifically, the substrate 912 and precursor layer(s) 916 and/or 918 may be heated from an ambient temperature to a plateau temperature range of between about 200° C. and about 600° C. The temperature is maintained in the plateau range for a period of time ranging between about a fraction of a second to about 60 minutes, and subsequently reduced.

Optionally, as shown in FIG. 13D, it should be understood that a layer 924 containing elemental chalcogen particles may be applied over the precursor layers 916 and/or 918 prior to heating. Of course, if the material stack does not include a second precursor layer, the layer 924 is formed over the precursor layer 916. By way of example, and without loss of generality, the chalcogen particles may be particles of selenium, sulfur or tellurium. Such particles may be fabricated as described above. The chalcogen particles in the layer 924 may be between about 1 nanometer and about 25 microns in size, preferably between 50 nm and 500 nm. The chalcogen particles may be mixed with solvents, carriers, dispersants etc. to prepare an ink or a paste that is suitable for wet deposition over the precursor layer 916 and/or 918 to form the layer 924. Alternatively, the chalcogen particles may be prepared for deposition on a substrate through dry processes to form the layer 924.

Optionally, as shown in FIG. 13E, a layer 926 containing an additional chalcogen source, and/or an atmosphere containing a chalcogen source, may optionally be applied to layer 922, particularly if layer 924 was not applied in FIG. 13D. Heat 928 may optionally be applied to layer 922 and the layer 926 and/or atmosphere containing the chalcogen source to heat them to a temperature sufficient to melt the chalcogen source and to react the chalcogen source with the group IB element and group IIIA elements in the precursor layer 922. The heat 928 may be applied in a rapid thermal annealing process, e.g., as described above. The reaction of the chalcogen source with the group IB and IIIA elements forms a compound film 930 of a group IB-IIIA-chalcogenide compound as shown in FIG. 13F. Preferably, the group IB-IIIA-chalcogenide compound is of the form $Cu_zIn_{1-x}Ga_xSe_{2(1-y)}S_{2y}$, where $0 \leq x \leq 1$, $0 \leq y \leq 1$, and $0.5 \leq y \leq 1.5$.

Referring still to FIGS. 13A-13F, it should be understood that sodium may also be used with the precursor material to improve the qualities of the resulting film. In a first method, as discussed in regards to FIGS. 13A and 13B, one or more layers of a sodium containing material may be formed above and/or below the precursor layer 916. The formation may occur by solution coating and/or other techniques such as but not limited to sputtering, evaporation, CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the nanoflakes and/or particles in the precursor layer 916. As a nonlimiting example, the nanoflakes and/or other particles in the precursor layer 916 may be a sodium containing material such as, but not limited to, Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, and/or Cu—In—Ga—S—Na. In one embodiment of the present invention, the amount of sodium in the nanoflakes and/or other particles may be less than about 1 at. % or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include nanoflakes (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved. The sodium may be in "aggregate" form of the sodium compound (e.g. dispersed particles), and the "molecularly dissolved" form.

None of the three aforementioned methods are mutually exclusive and may be applied singly or in any single or multiple combination to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. As a nonlimiting example, basically, any deprotonated alcohol where the proton is replaced by sodium, any deprotonated organic and inorganic acid, the sodium salt of the (deprotonated) acid, sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 13F, it should also be understood that sodium and/or a sodium compound may be added to the processed chalcogenide film after the precursor layer has been sintered or otherwise processed. This embodiment of the present invention thus modifies the film after CIGS formation. With sodium, carrier trap levels associated with the grain boundaries are reduced, permitting improved electronic properties in the film. A variety of sodium containing materials such as those listed above may be deposited as layer 932 onto the processed film and then annealed to treat the CIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Referring now to FIG. 14, embodiments of the invention may be compatible with roll-to-roll manufacturing. Specifically, in a roll-to-roll manufacturing system 1000 a flexible substrate 1001, e.g., aluminum foil travels from a supply roll 1002 to a take-up roll 1004. In between the supply and take-up rolls, the substrate 1001 passes a number of applicators 1006A, 1006B, 1006C, e.g. microgravure rollers and heater units 1008A, 1008B, 1008C. Each applicator deposits a different layer or sub-layer of a photovoltaic device active layer, e.g., as described above. The heater units are used to anneal the different sub-layers. In the example depicted in FIG. 14, applicators 1006A and 1006B may be applied different sub-layers of a precursor layer (such as precursor layer 106, precursor layer 916, or precursor layer 918). Heater units 1008A and 1008B may anneal each sub-layer before the next sub-layer is deposited. Alternatively, both sub-layers may be annealed at the same time. Applicator 1006C may apply a layer of material containing chalcogen particles as described above. Heater unit 1008C heats the chalcogen layer and precursor layer as described above. Note that it is also possible to deposit the precursor layer (or sub-layers) then deposit the chalcogen-containing layer and then heat all three layers together to form the IB-IIIA-chalcogenide compound film used for the photovoltaic absorber layer.

The total number of printing steps can be modified to construct absorber layers with bandgaps of differential gradation. For example, additional layers (fourth, fifth, sixth, and so forth) can be printed (and optionally annealed between printing steps) to create an even more finely-graded bandgap within the absorber layer. Alternatively, fewer films (e.g. double printing) can also be printed to create a less finely-graded bandgap. For any of the above embodiments, it is possible to have different amounts of chalcogen in each layer as well to vary crystal growth that may be influenced by the amount of chalcogen present.

Additionally, it should be understood that any number of combinations of flake and non-flake particles may be used according to the present invention in the various layers. As a nonlimiting example, the combinations may include but are not limited to:

TABLE VI

| | |
|---|---|
| Combination 1 | 1) chalcogenide (flake) + non-chalcogenide (flake) |
| Combination 2 | 2) chalcogenide (flake) + non-chalcogenide (non-flake) |
| Combination 3 | 3) chalcogenide (non-flake) + non-chalcogenide (flake) |
| Combination 4 | 4) chalcogenide (non-flake) + non-chalcogenide (non-flake) |
| Combination 5 | 5) chalcogenide (flake) + chalcogenide (flake) |
| Combination 6 | 6) chalcogenide (flake) + chalcogenide (non-flake) |
| Combination 7 | 7) chalcogenide (non-flake) + chalcogenide (non-flake) |
| Combination 8 | 8) non-chalcogenide (flake) + non-chalcogenide (flake) |
| Combination 9 | 9) non-chalcogenide (flake) + non-chalcogenide (non-flake) |
| Combination 10 | 10) non-chalcogenide (non-flake) + non-chalcogenide (non-flake) |

Although not limited to the following, the chalcogenide and non-chalcogenide materials may be selected from any of those listed in the Tables IV and V.

Reduced Melting Temperature

In yet another embodiment of the present invention, the ratio of elements within a particle or flake may be varied to produce more desired material properties. In one nonlimiting example, this embodiment comprises using desired stoichiometric ratios of elements so that the particles used in the ink have a reduced melting temperature. By way of nonlimiting example, for a group IB chalcogenide, the amount of the group IB element and the amount of the chalcogen is controlled to move the resulting material to a portion of the phase diagram that has a reduced melting temperature. Thus for $Cu_xSe_y$, the values for x and y are selected to create a material with reduced melting temperature as determined by reference to a phase diagram for the material. Phase diagrams for the following materials may be found in ASM Handbook, Volume 3 Alloy Phase Diagrams (1992) by ASM International and fully incorporated herein by reference for all purposes. Some specific examples may be found on pages 2-168, 2-170, 2-176, 2-178, 2-208, 2-214, 2-257, and/or 2-259.

As a nonlimiting example, copper selenide has multiple melting temperatures depending on the ratio of copper to selenium in the material. Everything more Se-rich (i.e. right on the binary phase diagram with pure Cu on the left and pure Se on the right) of the solid-solution $Cu_2$-xSe will create liquid selenium. Depending on composition, the melting temperature may be as low as 221° C. (more Se rich than $Cu_1Se_2$), as low as 332° C. (for compositions between $Cu_1Se_1$ & $Cu_1Se_2$), and as low as 377° C. (for compositions between $Cu_2$-xSe and $Cu_1Se_1$). At 523° C. and above, the material is all liquid for Cu—Se that is more Se-rich than the eutectic (~57.9 wt.-% Se). For compositions in between the solid-solution $Cu_2$-xSe and the eutectic (~57.9 wt.-% Se), it will create a solid solid-solution $Cu_2$-xSe and liquid eutectic (~57.9 wt.-% Se) at 523° C. and just above.

Another nonlimiting example involves gallium selenide which may have multiple melting temperatures depending on the ratio of gallium to selenium in the material. Everything more Se-rich (i.e. right on the binary phase diagram with pure Ga on the left and pure Se on the right) than $Ga_2Se_3$ will create liquid above 220° C., which is mainly pure Se. Making Ga—Se more Se-rich than $Ga_1Se_1$ is possible by making e.g. the compound $Ga_2Se_3$ (or anything more Se-rich than $Ga_1Se_1$), but only when adding other sources of selenium when working with a composition in between or equal to $Ga_1Se_1$ and $Ga_2Se_3$ (being an additional source of selenium or Se-rich Cu—Se) will liquefy the Ga—Se at processing temperature. Hence, an additional source of Se may be provided to facilitate the creation of a liquid involving gallium selenide.

Yet another nonlimiting example involves indium selenide which may have multiple melting temperatures depending on the ratio of indium to selenium in the material. Everything more Se-rich (i.e. right on the binary phase diagram with pure In on the left and pure Se on the right) than $In_2Se_3$ will create liquid above 220° C., which is mainly pure Se. Making In—Se more Se-rich than $In_1Se_1$ would create liquid for $In_2Se_3$ and also for $In_6Se_7$ (or a bulk composition in between $In_1Se_1$ and Se), but when dealing with a composition between or equal to $In_1Se_1$ and $In_2Se_3$, only by adding other sources of selenium (being an additional source of selenium or Se-rich Cu—Se) the In—Se will liquefy at processing temperature. Optionally for In—Se, there is another way of creating more liquid by going in the "other" direction and using compositions that are less Se-rich (i.e. left on the binary phase diagram). By using a material composition between pure In and $In_4Se_3$ (or between In and $In_1Se_1$ or between In and In6Se7 depending on temperature), pure liquid In can be created at 156° C. and even more liquid at 520° C. (or at a higher temperature when going more Se-rich moving from the eutectic point of ~24.0 wt.-% Se up to $In_1Se_1$). Basically, for a bulk composition less Se-rich than the In—Se eutectic (~24.0 wt.-% Se), all the In—Se will turn into a liquid at 520° C. Of course, with these type of Se poor materials, one of the other particles (such as but not limited to $Cu_1Se_2$ and/or Se) will be needed to increase the Se content, or another source of Se.

Accordingly, liquid may be created at our processing temperature by: 1) adding a separate source of selenium, 2) using Cu—Se more Se-rich than $Cu_2$-xSe, 3) using Ga-emulsion (or In—Ga emulsion), or In (in an air free environment), or 4) using In—Se less Se-rich than In1Se1 though this may also require an air free environment. When copper selenide is used, the composition may be $Cu_xSe_y$, wherein x is in the range of about 2 to about 1 and y is in the range of about 1 to about 2. When indium selenide is used, the composition may be $In_xSe_y$, wherein x is in the range of about 1 to about 6 and y is in the range of about 0 to about 7. When gallium selenide is used, the composition may be $Ga_xSe_y$, wherein x is in the range of about 1 to about 2 and y is in the range of about 1 to about 3.

It should be understood that adding a separate source of selenium will make the composition behave initially as more Se-rich at the interface of the selenide particle and the liquid selenium at the processing temperature.

Chalcogen Vapor Environment

Figure 15A:
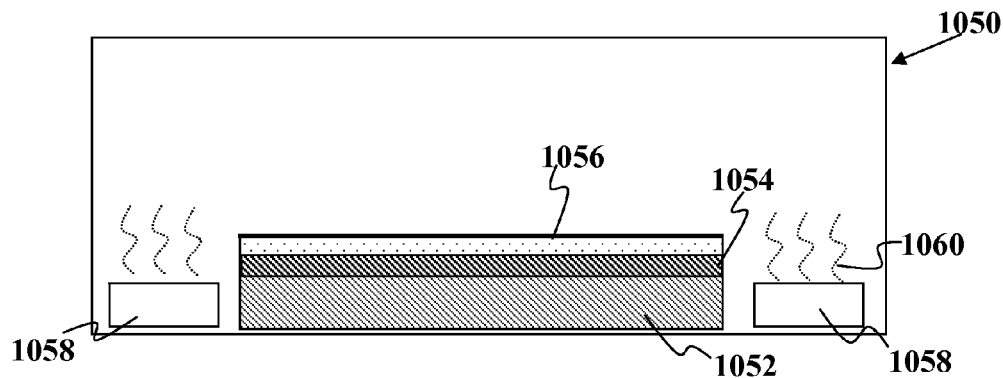
FIG. 15A shows a schematic of a system using a chalcogen vapor environment according to one embodiment of the present invention.

Referring now to FIG. 15A, yet another embodiment of the present invention will now be described. In this embodiment for use with a nanoflake precursor material, it should be understood that overpressure from chalcogen vapor is used to provide a chalcogen atmosphere to improve processing of the film and crystal growth. FIG. 15A shows a chamber 1050 with a substrate 1052 having a contact layer 1054 and a precursor layer 1056. Extra sources 1058 of chalcogen are included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law PV=nRT, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen overpressure may be provided by supplying a source producing a chalcogen vapor. The chalcogen vapor may serve to help keep the chalcogen in the film. Thus, the chalcogen vapor may or may not be used to provide excess chalcogen. It may serve more to keep the chalcogen present in the film than to provide more chalcogen into the film.

Figure 15B:
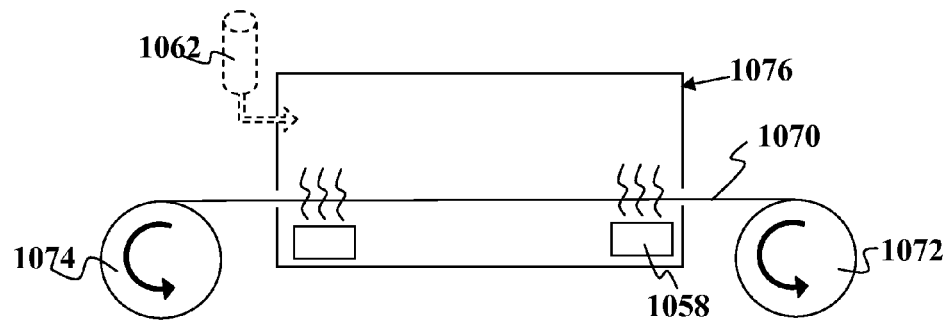
FIG. 15B shows a schematic of a system using a chalcogen vapor environment according to one embodiment of the present invention.

Referring now to FIG. 15B, it shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

Figure 15C:
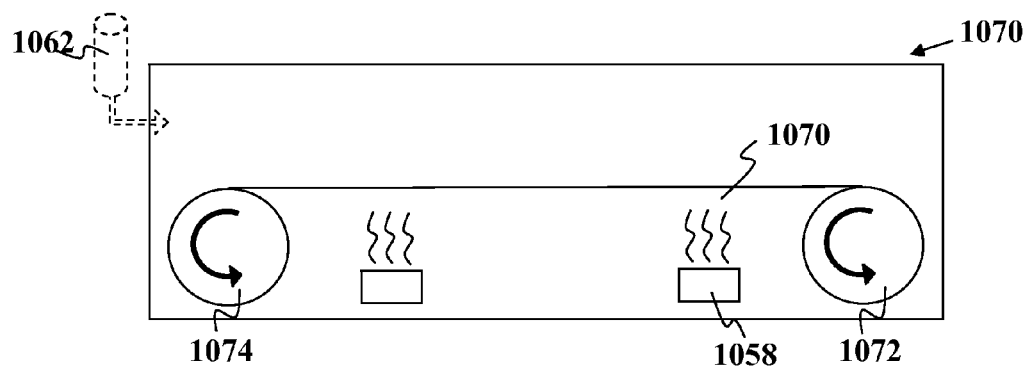
FIG. 15C shows a schematic of a system using a chalcogen vapor environment according to one embodiment of the present invention.

Referring now to FIG. 15C, yet another embodiment of the present invention uses a chamber 1090 of sufficient size to hold the entire substrate, including any rolls 1072 or 1074 associated with using a roll-to-roll configuration.

Figure 16A:
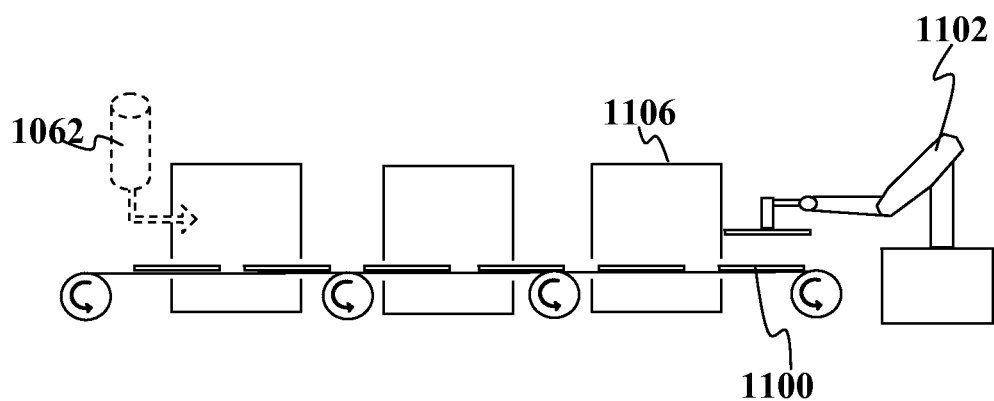
FIG. 16A shows one embodiment of a system for use with rigid substrates according to one embodiment of the present invention.

Referring now to FIG. 16A, it should also be understood that the embodiments of the present invention may also be used on a rigid substrate 1100. By way of nonlimiting example, the rigid substrate 1100 may be glass, soda-lime glass, steel, stainless steel, aluminum, polymer, ceramic, coated polymer, or other rigid material suitable for use as a solar cell or solar module substrate. A high speed pick-and-place robot 1102 may be used to move rigid substrates 1100 onto a processing area from a stack or other storage area. In FIG. 16A, the substrates 1100 are placed on a conveyor belt which then moves them through the various processing chambers. Optionally, the substrates 1100 may have already undergone some processing by the time and may already include a precursor layer on the substrate 1100. Other embodiments of the invention may form the precursor layer as the substrate 1100 passes through the chamber 1106.

Figure 16B:
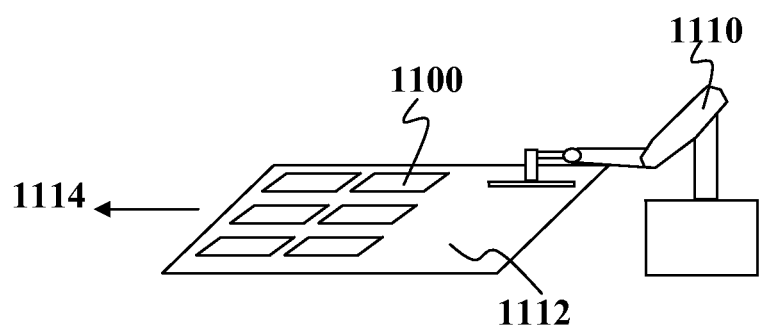
FIG. 16B shows one embodiment of a system for use with rigid substrates according to one embodiment of the present invention.

FIG. 16B shows another embodiment of the present system where a pick-and-place robot 1110 is used to position a plurality of rigid substrates on a carrier device 1112 which may then be moved to a processing area as indicated by arrow 1114. This allows for multiple substrates 1100 to be loaded before they are all moved together to undergo processing.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, nanoflakes may be replaced by and/or mixed with microflakes wherein the lengths and/or largest lateral dimension of the planar microflakes are about 500 nm or larger. The microflakes may each have a longest dimension less than about 5 microns and greater than about 500 nm. The microflakes may each have a length between about 3 microns and about 500 nm. The particles may be microflakes having lengths of greater than 500 nm. The particles may be microflakes having lengths of greater than 750 nm. The microflakes may each have a thickness of about 100 nm or less. The particles may be microflakes having thicknesses of about 75 nm or less. The particles may be microflakes having thicknesses of about 50 nm or less. The microflakes may each have a thickness less than about 20 nm. The microflakes may have lengths of less than about 2 microns and thicknesses of less than 100 nm. The microflakes may have lengths of less than about 1 microns and a thicknesses of less than 50 nm. The microflakes may have an aspect ratio of at least about 10 or more. The microflakes have an aspect ratio of at least about 15 or more.

As mentioned, some embodiments of the invention may include both nanoflakes and microflakes. Other may include flakes that are exclusively in the size range of nanoflakes or the size range of microflakes. With any of the above embodiments, the microflakes may be replaced by microrods which are substantially linear, elongate members. With any of the above embodiments, the nanoflakes may be replaced by nanorods which are substantially linear, elongate members. Still further embodiments may combine nanorods with nanoflakes in the precursor layer. Any of the above embodiments may be used on rigid substrate, flexible substrate, or a combinations of the two such as but not limited to a flexible substrate that become rigid during processing due to its material properties. In one embodiment of the present invention, the particles may be plates and/or discs and/or flakes and/or wires and/or rods of micro-sized proportions. In another embodiment of the present invention, the particles may be nanoplates and/or nanodiscs and/or nanoflakes and/or nanowires and/or nanorods of nano-sized proportions.

For any of the above embodiments, it should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. For any of the above embodiments, it is also possible to have two or more elements of IB elements in the chalcogenide particle and/or the resulting film.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following related applications are fully incorporated herein by reference for all purposes: U.S. patent application Ser. No. 13/361,522, filed on Feb. 23, 2006, U.S. patent application Ser. No. 11/361,498, filed on Feb. 23, 2006, U.S. patent application Ser. No. 11/361,433, filed on Feb. 23, 2006, U.S. patent application Ser. No. 11/361,521, filed on Feb. 23, 2006, U.S. patent application Ser. No. 11/361,497, filed on Feb. 23, 2006, U.S. patent application Ser. No. 11/361,515, filed on Feb. 23, 2006, U.S. patent application Ser. No. 11/361,464, filed on Feb. 23, 2006, U.S. patent application Ser. No. 11/361,523, filed on Feb. 23, 2006, and U.S. patent application Ser. No. 11/361,103, filed on Feb. 23, 2006. The following applications are also incorporated herein by reference for all purposes: U.S. patent application Ser. No. 11/290,633 entitled "CHALCOGENIDE SOLAR CELLS" filed Nov. 29, 2005, U.S. patent application Ser. No. 10/782,017, entitled "SOLUTION-BASED FABRICATION OF PHOTOVOLTAIC CELL" filed Feb. 19, 2004, U.S. patent application Ser. No. 10/943,657, entitled "COATED NANOPARTICLES AND QUANTUM DOTS FOR SOLUTION-BASED FABRICATION OF PHOTOVOLTAIC CELLS" filed Sep. 18, 2004, and U.S. patent application Ser. No. 11/081,163, entitled "METALLIC DISPERSION", filed Mar. 16, 2005, and U.S. patent application Ser. No. 10/943,685, entitled "FORMATION OF CIGS ABSORBER LAYERS ON FOIL SUBSTRATES", filed Sep. 18, 2004, the entire disclosures of which are incorporated herein by reference.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
formulating an ink of particles wherein about 50% or more of the particles are flakes each containing at least one element from group IB, IIIA and/or VIA and having a non-spherical, planar shape, wherein overall amounts of elements from group IB, IIIA and/or VIA contained in the ink are such that the ink has a desired stoichiometric ratio of the elements, wherein the flakes each have a longest dimension between about 5 microns and greater than about 500 nm;

coating a substrate with the ink to form a precursor layer; and processing the precursor layer in one or more steps to form a dense film.

2. The method of claim 1 wherein the flakes have an aspect ratio of at least about 5 or more.

3. The method of claim 1 wherein the flakes may have an aspect ratio of at least about 10 or more.

4. The method of claim 1 wherein the flakes have an aspect ratio of at least about 15 or more.

5. The method of claim 1 wherein the planar shape of the flakes creates greater surface area contact between adjacent flakes that allows the dense film to form at a lower temperature and/or shorter time as compared to a film made from a precursor layer using an ink of spherical nanoparticles wherein the nanoparticles have a substantially similar material composition and the ink is otherwise substantially identical to the ink of claim 1.

6. The method of claim 1 wherein the planar shape of the flakes creates greater surface area contact between adjacent flakes that allows the dense film to form at an annealing temperature at least 50 degrees C. less as compared to a film made from a precursor layer using an ink of spherical nanoparticles that is otherwise substantially identical to the ink of claim 1.

7. The method of claim 1 wherein the planar shape of the flakes creates greater surface area contact between adjacent flakes relative to adjacent spherical nanoparticles and thus promotes increased atomic intermixing as compared to a film made from a precursor layer made from an ink of claim 1.

8. The method of claim 1 wherein the planar shape of the flakes creates a higher packing density in the precursor layer that forms the dense film as compared to a film made from a precursor layer made from an ink of spherical nanoparticles of the same composition that is otherwise substantially identical to the ink of claim 1.

9. The method of claim 1 wherein the planar shape of the flakes creates a packing density of at least 76% in the precursor layer.

10. The method of claim 1 wherein the planar shape of the flakes creates a packing density of at least 95% in the precursor layer.

11. The method of claim 3 wherein the planar shape of the flakes results in grain sizes of at least about 2.0 µm in at least one dimension in the semiconductor absorber of a photovoltaic device.

12. The method of claim 3 wherein the planar shape of the flakes results in grain sizes of at least about 1.0 µm in at least one dimension in the semiconductor absorber of a photovoltaic device.

13. The method of claim 1 wherein the planar shape of the flakes provides a material property to allow for a more even distribution of group IIA material throughout in the dense film as compared to a film made from a precursor layer made from an ink of spherical nanoparticles that is otherwise substantially identical to the ink of claim 5.

14. The method of claim 1 wherein the flakes have length of less than about 2 microns and a thickness of less than 100 nm.

15. The method of claim 1 wherein the flakes have length of less than about 1 microns and a thickness of less than 50 nm.

16. The method of claim 1 wherein the flakes are comprised of a binary alloy of group IB, IIIA elements.

17. The method of claim 1 wherein the flakes are comprised of a ternary alloy of group IB, IIIA elements.

18. The method of claim 1 wherein the flakes are comprised of a quaternary alloy of group IB, IIIA, and/or VIA elements.

19. The method of claim 1 wherein the flakes have between about 5 wt % of oxygen to about 0.1 wt % oxygen.

20. The method of claim 1 wherein the film is formed from a precursor layer of the flakes and a layer of a sodium containing material in contact with the precursor layer and/or nanoflakes containing at least one of the following materials: Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, or Cu—In—Ga—S—Na; and/or an ink containing the nanoflakes and a sodium compound with an organic counter-ion or a sodium compound with an inorganic counter-ion.

\* \* \* \* \*